USO11243375B2

(12) United States Patent
Sasaki et al.

(10) Patent No.: US 11,243,375 B2
(45) Date of Patent: Feb. 8, 2022

(54) IMAGING APPARATUS

(71) Applicant: CANON KABUSHIKI KAISHA, Tokyo (JP)

(72) Inventors: Daisuke Sasaki, Kawasaki (JP); Yujiro Idaka, Tokyo (JP); Seigo Kaneko, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 532 days.

(21) Appl. No.: 15/793,775

(22) Filed: Oct. 25, 2017

(65) Prior Publication Data

US 2018/0120531 A1 May 3, 2018

(30) Foreign Application Priority Data

Oct. 28, 2016 (JP) .............................. JP2016-211527
Jul. 28, 2017 (JP) .............................. JP2017-146340

(51) Int. Cl.
*G02B 7/04* (2021.01)
*H05K 1/02* (2006.01)
*G02B 7/02* (2021.01)
*G03B 17/12* (2021.01)
*G03B 17/56* (2021.01)
*H04N 5/225* (2006.01)
(Continued)

(52) U.S. Cl.
CPC ............... *G02B 7/04* (2013.01); *G02B 7/023* (2013.01); *G03B 17/12* (2013.01); *G03B 17/565* (2013.01); *H04N 5/2254* (2013.01); *H05K 1/028* (2013.01); *H05K 1/0393* (2013.01); *G08B 13/1963* (2013.01); *H05K 1/0237* (2013.01); *H05K 1/0245* (2013.01); *H05K 1/189* (2013.01)

(58) Field of Classification Search
CPC .......... G02B 7/04; G02B 7/023; G03B 17/12; G03B 17/565
See application file for complete search history.

(56) References Cited

U.S. PATENT DOCUMENTS 6,867,668 B1 * 3/2005 Dagostino ............... H01L 23/66
257/E23.065
2004/0070684 A1 4/2004 Horigome
(Continued)

FOREIGN PATENT DOCUMENTS

CN 1885142 A 12/2006
CN 1897738 A 1/2007
(Continued)

Primary Examiner — Christopher Stanford
Assistant Examiner — Journey F Sumlar
(74) Attorney, Agent, or Firm — Canon U.S.A., Inc. IP Division

(57) ABSTRACT

An imaging apparatus according to the present invention includes a lens unit including an image sensor, and configured to be rotatable about a tilt rotation axis, a rotating unit configured to be rotatable about a pan rotation axis, a non-rotating unit to which the rotating unit is rotatably attached, and a flexible printed circuit configured to connect the lens unit with the non-rotating unit. The flexible printed circuit includes an arc-shaped first portion coaxial with the pan rotation axis in a plane perpendicular to the pan rotation axis, and an arc-shaped second portion coaxial with the tilt rotation axis in a plane perpendicular to the tilt rotation axis. The first portion is bent around an axis orthogonal to the pan rotation axis.

30 Claims, 33 Drawing Sheets

(51) Int. Cl.
    *H05K 1/03*     (2006.01)
    *G08B 13/196*     (2006.01)
    *H05K 1/18*     (2006.01)

(56)     References Cited

U.S. PATENT DOCUMENTS

| | | |
|---|---|---|
| 2005/0083590 A1 | 4/2005 | Tanigawa et al. |
| 2010/0051774 A1 | 3/2010 | Shi |
| 2012/0307365 A1 | 12/2012 | Lee et al. |
| 2013/0038724 A1 | 2/2013 | McCormick |
| 2015/0114162 A1 | 4/2015 | Kirihara |

FOREIGN PATENT DOCUMENTS

| | | | | |
|---|---|---|---|---|
| CN | 101742121 A | 6/2010 | | |
| CN | 102243360 A | 11/2011 | | |
| CN | 205402194 U | 7/2016 | | |
| EP | 2192444 B1 * | 12/2011 | ......... | G08B 13/1963 |
| JP | 2002-152960 A | 5/2002 | | |
| JP | 2005-102405 A | 4/2005 | | |
| JP | 2005100700 A * | 4/2005 | | |
| JP | 2009-288642 A | 12/2009 | | |
| JP | 2015-220938 A | 12/2015 | | |

* cited by examiner

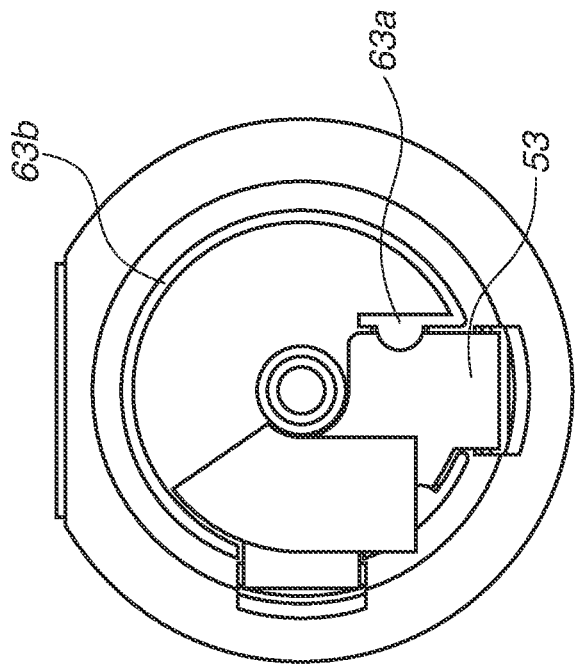
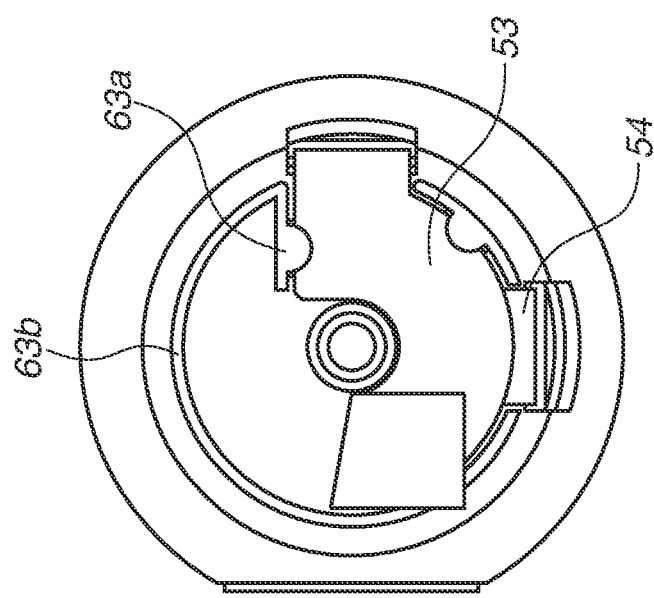

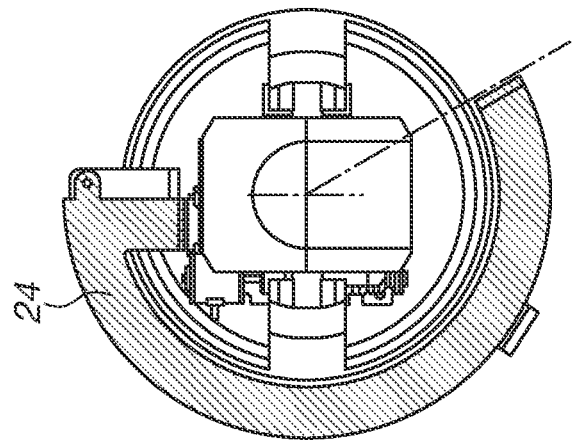
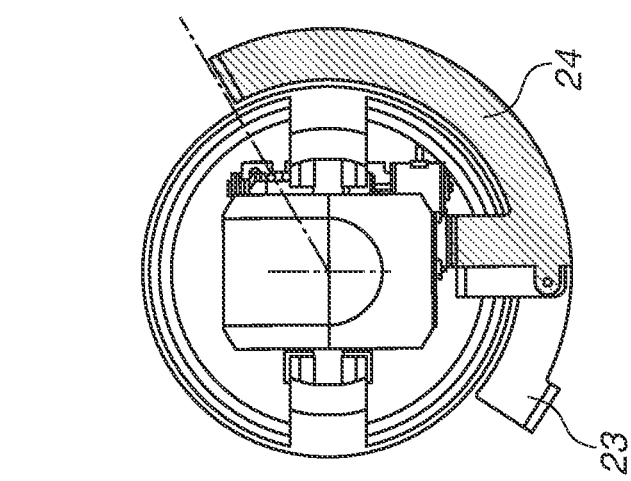
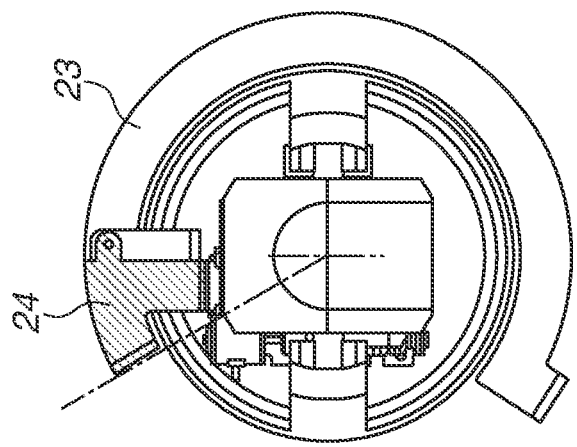

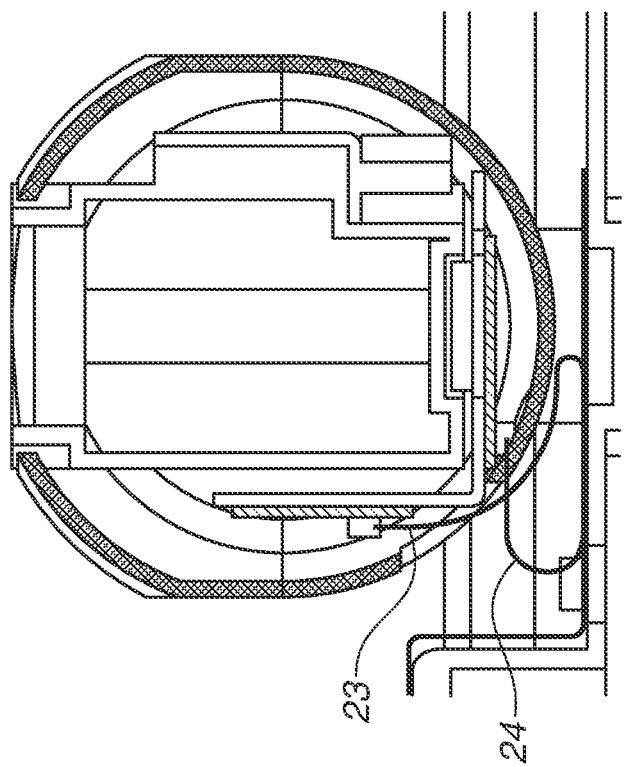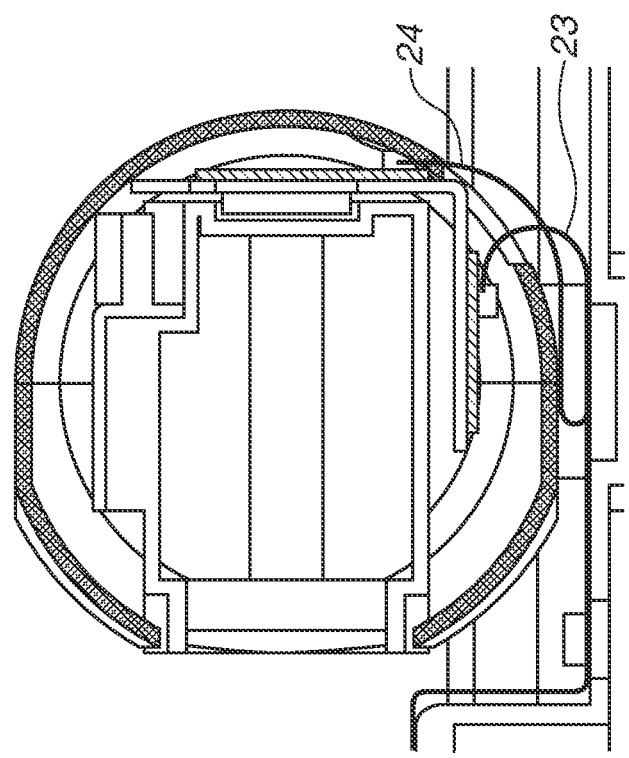

IMAGING APPARATUS

BACKGROUND OF THE INVENTION

Field of the Invention

The present invention relates to a wiring structure of a monitoring camera apparatus operable in pan and tilt directions.

Description of the Related Art

Among monitoring camera apparatuses to be installed on the ceiling and wall surfaces is a pan tilt camera, in which a lens unit can be operated in pan, tilt, and roll directions to monitor a plurality of places. A pan tilt camera includes a lens unit including an image sensor, and a fixed unit including an electric substrate. An imaging signal from the image sensor is transmitted from the lens unit to the electric substrate via a cable or a flexible printed circuit. The cable or flexible printed circuit needs to be configured to follow changes in route resulting from rotational movements of the lens unit in the pan, tilt, and roll directions.

As a conventional example in which a flexible printed circuit is used for a camera, Japanese Patent Application Laid-Open No. 2015-220938 discusses a rotation drive mechanism including a second member to be rotated with respect to a first member. A flexible printed circuit is connected to the second member. In the rotation drive mechanism discussed in Japanese Patent Application Laid-Open No. 2015-220938, the flexible printed circuit is formed as an arc-shaped thin plate along the rotation direction of the second member. The flexible printed circuit can be bent in its thickness direction at least in part of the circumferential portion.

A pan tilt camera needs two axes for pan and tilt. If, for example, the configuration discussed in Japanese Patent Application Laid-Open No. 2015-220938 is applied to a pan tilt camera, flexible printed circuits are needed for both pan and tilt rotations. There has thus been a problem of complicated configuration.

SUMMARY OF THE INVENTION

The present invention is directed to an imaging apparatus including a flexible printed circuit that can follow changes in route resulting from rotational movements without complication.

According to an aspect of the present invention, an imaging apparatus includes a lens unit including an image sensor, wherein the lens unit can be tilted about a tilt rotation axis, a rotating unit configured to be rotatable about a pan rotation axis, a non-rotating unit to which the rotating unit is rotatably attached, and a flexible printed circuit configured to connect the lens unit with the non-rotating unit, wherein the flexible printed circuit includes an arc-shaped first portion coaxial with the pan rotation axis in a plane perpendicular to the pan rotation axis, and an arc-shaped second portion coaxial with the tilt rotation axis in a plane perpendicular to the tilt rotation axis, and wherein the first portion is bent around an axis orthogonal to the pan rotation axis.

Further features of the present invention will become apparent from the following description of exemplary embodiments with reference to the attached drawings.

BRIEF DESCRIPTION OF THE DRAWINGS

FIGS. 5A and 5B are shape change diagrams of the flexible printed circuits according to the first exemplary embodiment.

FIGS. 10A, 10B, and 10C are shape change diagrams of the flexible printed circuits during a tilt rotation according to the second exemplary embodiment.

FIGS. 11A and 11B are shape change diagrams of the flexible printed circuits during a tilt rotation according to the second exemplary embodiment.

DESCRIPTION OF THE EMBODIMENTS

<Structure of Pan Tilt Camera>

Figure 1:
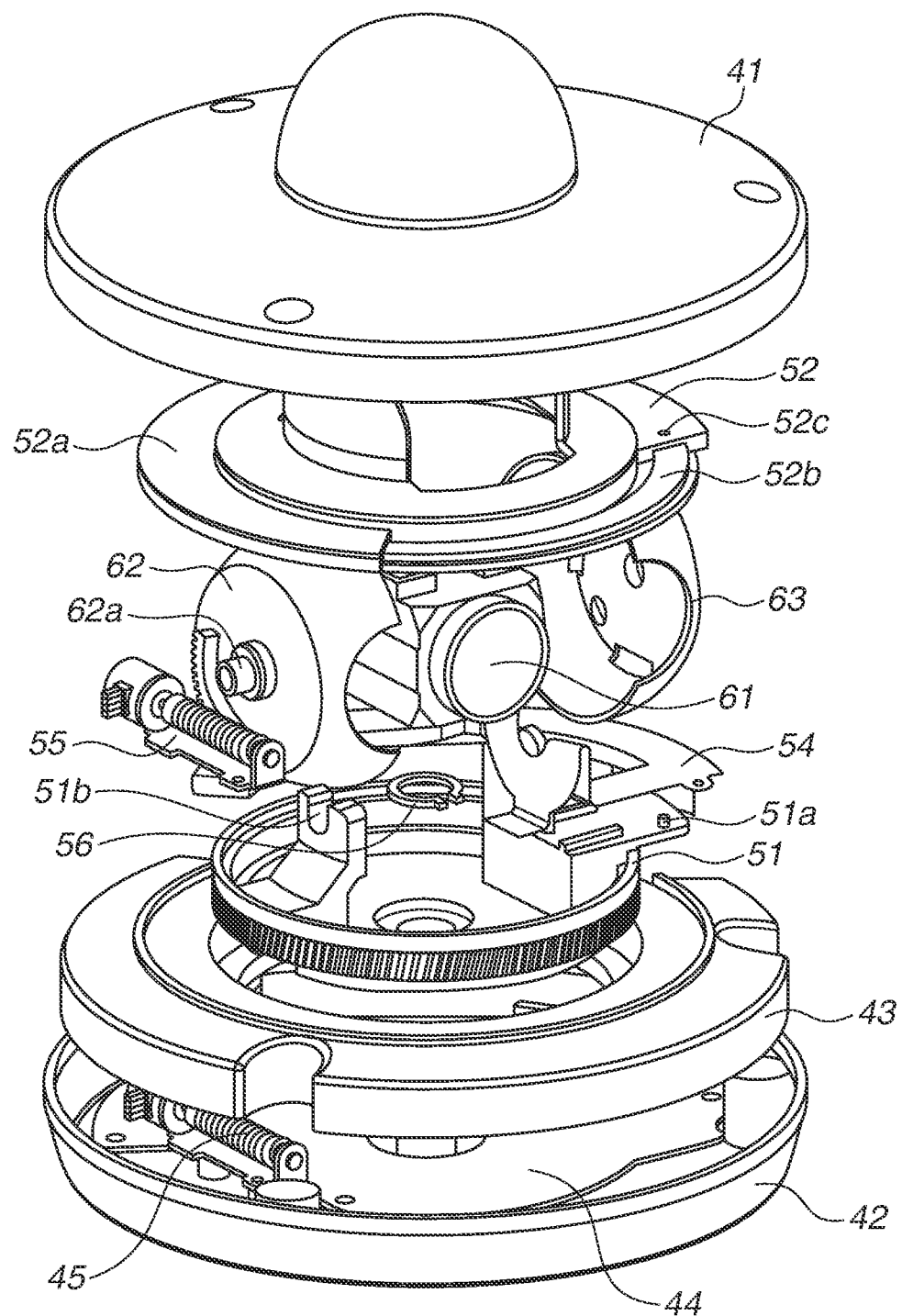
FIG. 1 is an exploded view of a pan tilt camera according to a first exemplary embodiment.

First, a first exemplary embodiment of the present invention will be described. FIG. 1 is an exploded view of a pan tilt camera according to the present exemplary embodiment. An electric substrate 44 and a motor unit 45 are attached to a bottom case 42. An inner case 43 is integrally attached to the bottom case 42. The bottom case 42, the inner case 43, the electric substrate 44, and the motor unit 45 constitute a non-rotating unit.

A pan rotation table 51 serving as a rotation unit is fitted to a protruding portion (not illustrated) at the center of the bottom case 42, and attached to the bottom case 42 by a stop ring 56 to be rotatable in a pan direction. The pan rotation table 51 includes a helical gear. By driving a worm gear of the motor unit 45, the pan rotation table 51 can rotate in the pan direction. Flexible printed circuits 53 and 54 are attached to the inner case 43. The flexible printed circuit 53 is an example of a first flexible printed circuit for controlling a lens unit 61. The flexible printed circuit 54 is an example of a second flexible printed circuit for transmitting an imaging signal from the lens unit 61.

Figure 2:
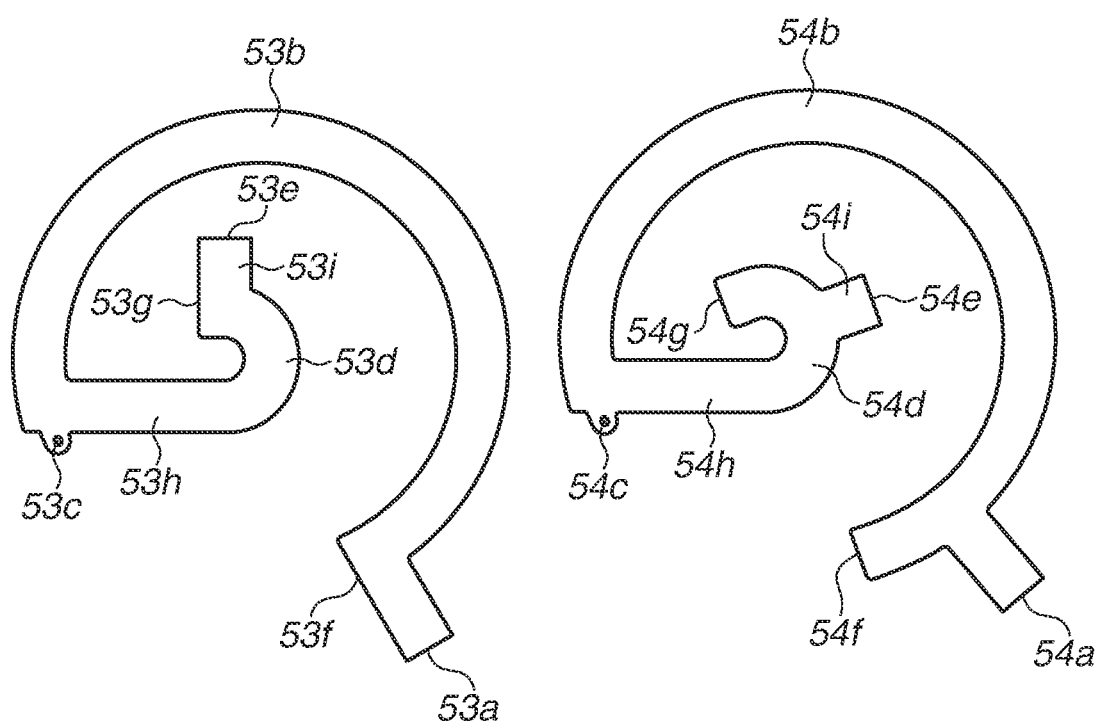
FIG. 2 is a developed configuration diagram of flexible printed circuits according to the first exemplary embodiment.
Figure 3:
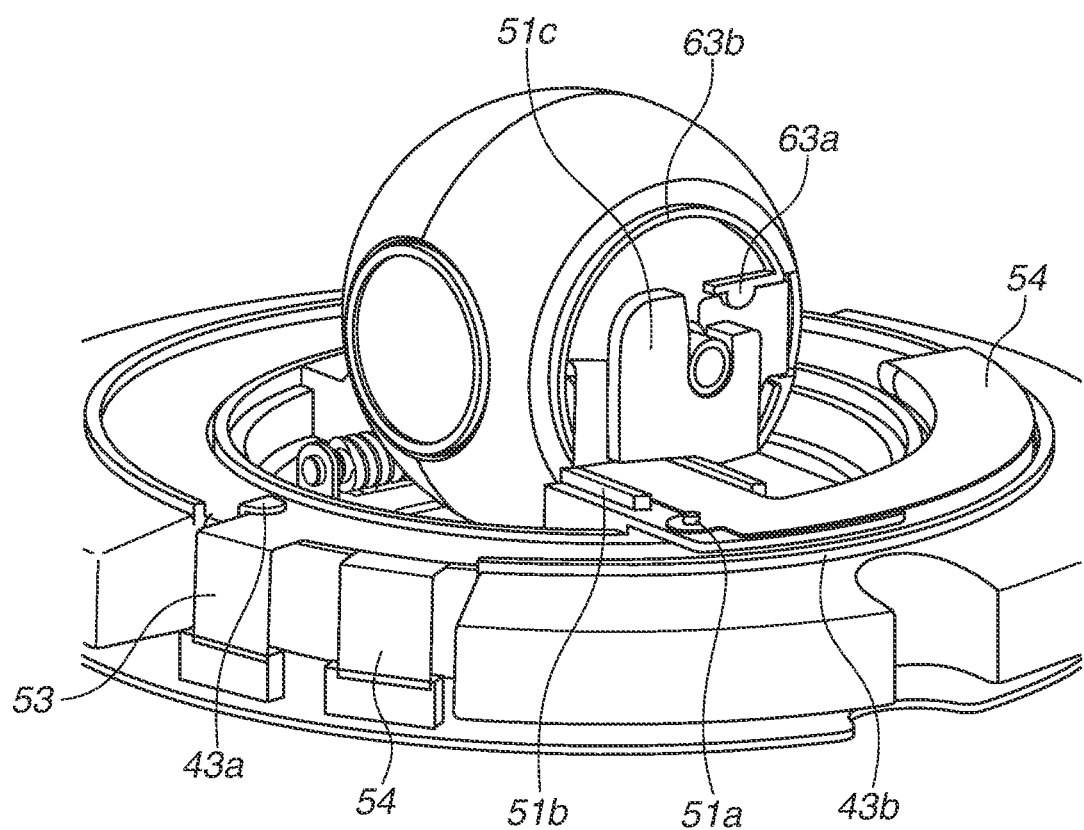
FIG. 3 is a detailed assembly diagram of the flexible printed circuits according to the first exemplary embodiment.

FIG. 2 is a developed configuration diagram of the flexible printed circuits 53 and 54 according to the present exemplary embodiment. FIG. 3 is a detailed assembly diagram of the flexible printed circuits 53 and 54 according to the present exemplary embodiment. Terminal portions 53a and 54a of the flexible printed circuits 53 and 54 are connector-connected (each connected using a connector) and fixed to the electric substrate 44. The flexible printed circuits 53 and 54 include arc-shaped first portions 53b and 54b, which are coaxial with a pan rotation axis (first axis). The arc-shaped first portions 53b and 54b, which are examples of arc portions, are arranged on a surface perpendicular to the pan rotation axis. The arc-shaped first portions 53b and 54b are bent around a second axis orthogonal to the pan rotation axis (first axis). Each second axis extends in a radial direction from the first axis, and the arc-shaped first portions are bent through substantially 180 degrees around their respective second axes. The inner case 43 includes a hook portion 43a for fixing portions 53f and 54f so that the flexible printed circuits 53 and 54 will not lift in the direction of the pan rotation axis during a pan rotation. The inner case 43 further includes a protruding portion 43b for guiding the arc-shaped first portions 53b and 54b so as to prevent the arc-shaped first portions 53b and 54b from shifting in a direction perpendicular to the pan rotation axis. The protruding portion 43b is arranged substantially around the entire circumference except where the flexible printed circuits 53 and 54 are fixed to the electric substrate 44. With this configuration, arc-shaped first portions 53b and 54b can be constantly maintained coaxial with the pan rotation axis.

The pan rotation table 51 includes a protruding portion 51a which is pressed and fitted into fixing holes 53c and 54c of the flexible printed circuits 53 and 54. The flexible printed circuits 53 and 54 are fixed so that the arc-shaped first portions 53b and 54b are bent around an axis orthogonal to the pan rotation axis and extending radially from the pan rotation axis. The pan rotation table 51 further includes protruding portions 51b and a fold-back guide portion 51c. The protruding portions 51b guide the flexible printed circuits 53 and 54 to a tilt rotation axis.

The flexible printed circuit 53 is arranged on the upper side of the inner case 43 with the flexible printed circuit 54 therebetween. Therefore, when the arc-shaped first portions 53b and 54b are bent, the flexible printed circuit 53 is arranged inside the flexible printed circuit 54. The arc-shaped first portions 53b and 54b need to be bent around respective different second axes orthogonal to the pan rotation axis so that the bending position of the flexible printed circuit 53 always lies in front of that of the flexible printed circuit 54. If the plurality of flexible printed circuits 53 and 54 is configured to be overlapped in such a manner, the bending axes orthogonal to the pan rotation axis can be made different by configuring the arc-shaped first portion 53b to be shorter than the first portion 45b. Alternatively, if the flexible printed circuits 53 and 54 are formed to have the same shape, the bending axes can be made different by overlapping the flexible printed circuits 53 and 54 in different positions on the same axis of the arc shape. In such a case, the hook portion 43a of the inner case 43 and the protruding portion 51a of the pan rotation table 51 need to be provided for each of the flexible printed circuits 53 and 54 separately.

An inner cover 52 is integrally attached to the pan rotation table 51. The inner cover 52 includes a groove shape 52a for guiding the folding portions when the arc-shaped first portions 53b and 54b of the flexible printed circuits 53 and 54 are bent. The inner cover 52 further includes a retaining portion 52b for preventing the flexible printed circuits 53 and 54 fixed to the inner case 43 from lifting. The retaining portion 52b is arranged in an area where the folding portions will not reach when the arc-shaped first portions 53b and 54b are bent. Further, the inner cover 52 includes a hole 52c. The protruding portion 51a of the pan rotation table 51, running through the fixing holes 53c and 54c of the flexible printed circuits 53 and 54, is fitted to the hole 52c, to prevent the flexible printed circuits 53 and 54 from coming off from the protruding portion 51a.

The inner cover 52 and the inner case 43 are configured to cover the arc-shaped first portions 53b and 54b of the flexible printed circuits 53 and 54. By forming both or at least one of the inner cover 52 and the inner case 43 with resin having an electromagnetic shielding property, noise of the flexible printed circuits 53 and 54 can be suppressed. A side cover 63 and a tilt gear case 62 are attached to a lens unit 61. The tilt gear case 62 includes a rotation shaft 62a which is fitted to and supported by a bearing portion 51d arranged on the pan rotation table 51. The tilt gear case 62 includes a helical gear. By driving a worm gear of a motor unit 55 fixed to the pan rotation table 51, the tilt gear case 62 can be driven to rotate in a tilt direction.

The flexible printed circuits 53 and 54 are fixed in a state where the arc-shaped first portions 53b and 54b are bent around an axis orthogonal to the tilt rotation axis. The side cover 63 includes a hook portion 63a for fixing the flexible printed circuits 53 and 54 so that the flexible printed circuits 53 and 54 will not lift in the direction of the tilt rotation axis during a tilt rotation. The side cover 63 further includes a protruding portion 63b for guiding the arc-shaped first portions 53b and 54b so as to prevent the arc-shaped first portions 53b and 54b from shifting in a direction perpendicular to the tilt rotation axis. With this configuration, the arc-shaped first portions 53b and 54b can be constantly maintained coaxial with the tilt rotation axis.

Figure 4:
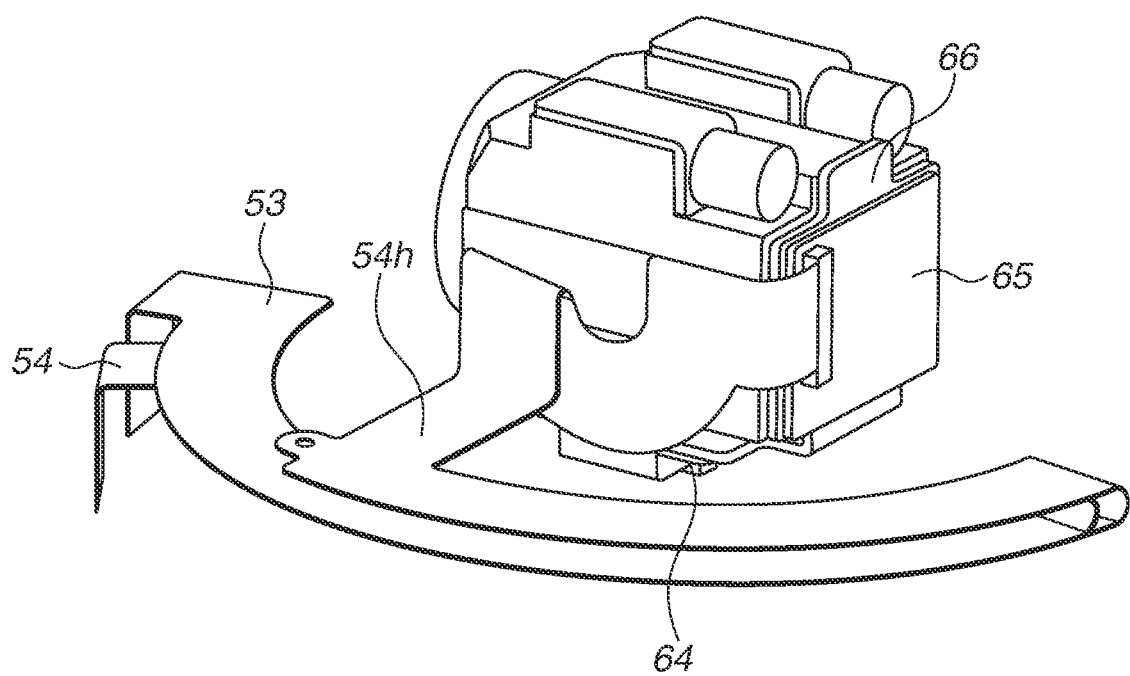
FIG. 4 is a diagram illustrating bending of the flexible printed circuits according to the first exemplary embodiment.

As illustrated in FIG. 4, a lens substrate 64, an imaging substrate 65, and a lens plate 66 are attached to the lens unit 61. The lens substrate 64 controls the lens unit 61. An image sensor is mounted on the imaging substrate 65. The lens plate 66 supports the imaging substrate 65.

As illustrated in FIGS. 2 and 4, the flexible printed circuit 53 includes another arc-shaped second portion 53d inside the arc-shaped first portion 53b. The arc-shaped second portion 53d of the flexible printed circuit 53 is bent perpendicularly to the tilt rotation axis. A fixing portion 53g of the flexible printed circuit 53 is fixed to the hook portion 63a of the side cover 63. A terminal portion 53e of the flexible printed circuit 53 is fixed and connected to the imaging substrate 65.

The flexible printed circuit 54 includes another arc-shaped second portion 54d inside the arc-shaped first portion 54b. The arc-shaped second portion 54d of the flexible printed circuit 54 is bent perpendicularly to the tilt rotation axis. A fixing portion 54g of the flexible printed circuit 54 is fixed to the hook portion 63a of the side cover 63. A terminal portion 54e of the flexible printed circuit 54 is fixed and connected to the lens substrate 64.

As illustrated in FIG. 2, the flexible printed circuits 53 and 54 include first straight portions 53h and 54h and second straight portions 53i and 54i. The first straight portions 53h and 54h connect the first portions 53b and 54b with the second portions 53d and 54d. The second straight portions 53i and 54i extend from the second portions 53d and 54d. As illustrated in FIG. 4, the first straight portions 53h and 54h are bent around an axis parallel with an optical axis of the lens unit 61. As illustrated in FIG. 4, the second straight portions 53i and 54i are bent to be arranged in parallel with the tilt rotation axis.

FIGS. 5A and 5B are shape change diagrams of the flexible printed circuits 53 and 54 during a tilt rotation according to the present exemplary embodiment. FIG. 5A illustrates the shape of the flexible printed circuits 53 and 54 when the lens optical axis of the lens unit 61 is horizontally directed. FIG. 5B illustrates the shape of the flexible printed circuits 53 and 54 when the lens optical axis of the lens unit 61 is vertically directed. The bending positions slide over the arc shape by the amount of movement always one half that of the tilt rotation.

A hole is formed in the inner cover 52 so that the lens unit 61, the side cover 63, and the tilt gear case 62 do not interfere during a tilt rotation. A transparent hemispherical dome cover is integrally attached to a top cover 41 to enable imaging regardless of pan and tilt orientations of the lens unit 61. The top cover 41 is fixed to the bottom case 42.

With the foregoing configuration, the rotation of the rotating unit only produces a change of the flexible printed circuits 53 and 54, in which the bending positions slide over the arc-shaped first portions 53b and 54b. Since the portions other than the arc-shaped first portions 53b and 54b do not change in route and orientation, durability thereof improves. Since the arc-shaped first portions 53b and 54b are bent only once, the configuration can be made small in the height direction. As seen in a plane of projection in the pan rotation axis direction, the moving range of the flexible printed circuits 53 and 54 is limited to the arc-shaped first portions 53b and 54b and their extended circle. Therefore, configuration can also be made small in the direction of the outer diameter about the pan rotation axis.

An exemplary embodiment of an imaging apparatus of the present invention has been described above. In the present exemplary embodiment, the imaging apparatus is configured in such a manner that the arc-shaped first portions 53b and 54b and second portions 53d and 54d are bent around axes orthogonal to the pan and tilt rotation axes, respectively. Such a configuration can be similarly applied to any combination of rotation directions including a roll rotation direction.

<Overall Structure of Flexible Printed Circuits>

Next, details of the flexible printed circuits 53 and 54 will be described.

The flexible printed circuit 53 is an example of a high-speed signal flexible printed circuit, and includes high-speed signal lines, which are electrical signal lines having the highest speed among those of electrical signals to be transmitted by the flexible printed circuits 53 and 54. The flexible printed circuit 53 will hereinafter be referred to as a high-speed signal flexible printed circuit (FPC) 201. The FPC 54 is an example of a low-speed signal FPC, and includes only low-speed signal lines different from the electrical signal lines having the highest speed. The FPC 54 will hereinafter be referred to as a low-speed signal FPC 301. Thus, the low signal FPC 301 transmits low-speed signals different from high-speed signals.

Figure 12:
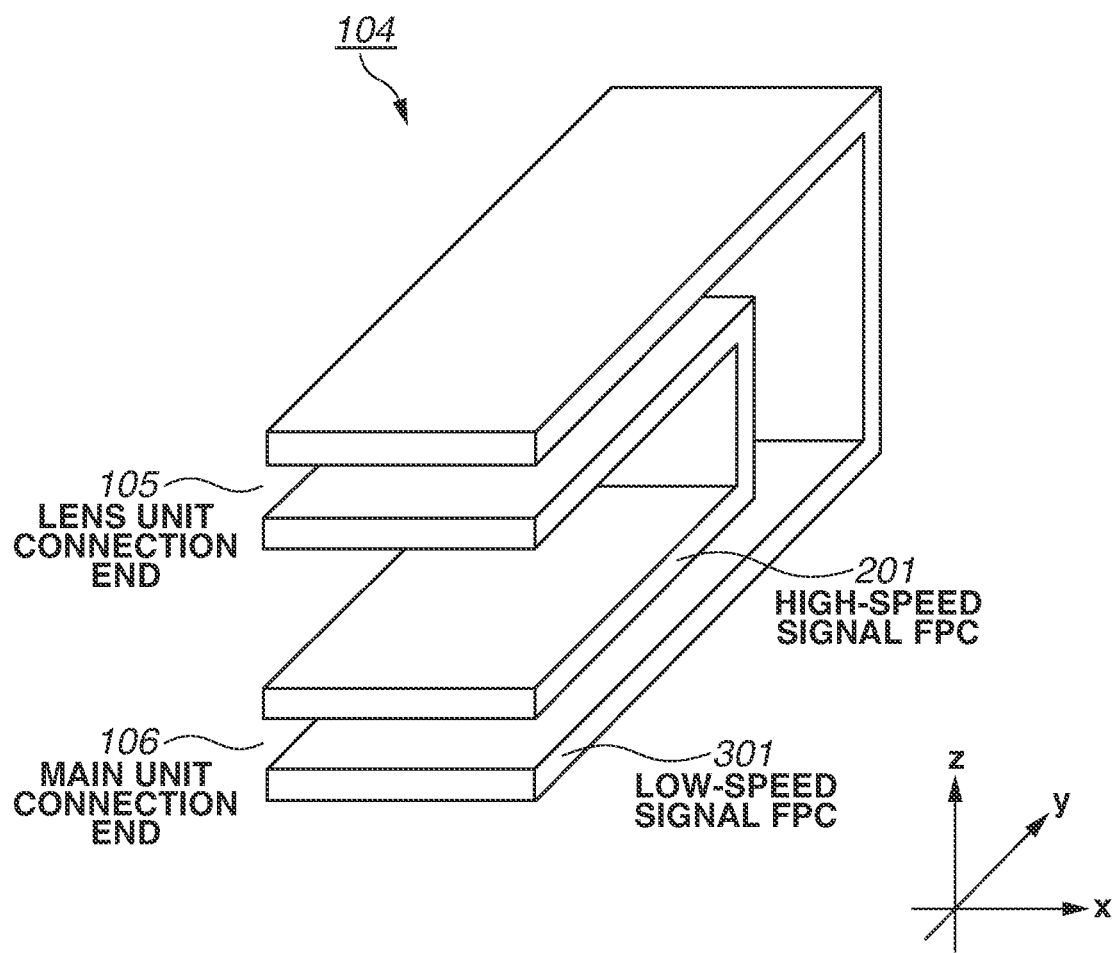
FIG. 12 is a structure diagram of the flexible printed circuits (FPCs) according to the first exemplary embodiment.

FIG. 12 illustrates an overall structure of the high- and low-speed signal FPCs 201 and 301 according to the first exemplary embodiment of the present invention. In FIG. 12, the x-axis direction is a width direction of the high- and low-speed signal FPCs 201 and 301. The y-axis direction is a length direction of the high- and low-speed signal FPCs 201 and 301. The z-axis direction is a thickness (height) direction of the high- and low-speed signal FPCs 201 and 301.

The high- and low-speed signal FPCs 201 and 301 both have a folding structure. With the folding structure, the high- and low-speed signal FPCs 201 and 301 are configured in a U shape. The high- and low-speed signal FPCs 201 and 301 each have overlapping surfaces as illustrated in FIG. 12, and the folded FPCs 201 and 301 are arranged to overlap each other. With this arrangement, the low-speed signal FPC 301 is arranged to cover the high-speed signal FPC 201. Such a U-shaped structure enables the low-speed signal FPC 301 to absorb radio waves radiated from the high-speed signal FPC 201 inside. This can reduce radiated waves and enable shielding without mechanical members.

The high- and low-speed signal FPCs 201 and 301 constitute an FPC 104 of divided structure. Such a divided structure significantly reduces the FPC width. For example, suppose that an FPC width of approximately 20 mm is needed to juxtapose all lines including signal lines, control signal lines, and power supply lines in a single layer FPC. Suppose also that the single layer FPC has a thickness of approximately 0.05 mm. If the FPC is divided into two and overlapped, the thickness doubles or increases by approximately 0.05 mm while the FPC width decreases to one half or by 10 mm. Although there is a gap between the FPCs and the foregoing does not apply completely, such a slight increase in thickness can reduce the width significantly. It should be noted that the numerical values are merely examples and not restrictive.

Longitudinal ends of the FPC 104 serve as connection terminals for respective units. The longitudinal ends will be referred to as a lens unit connection end 105 and a main unit connection end 106.

<Layer Structure of FPC>

Figure 13:
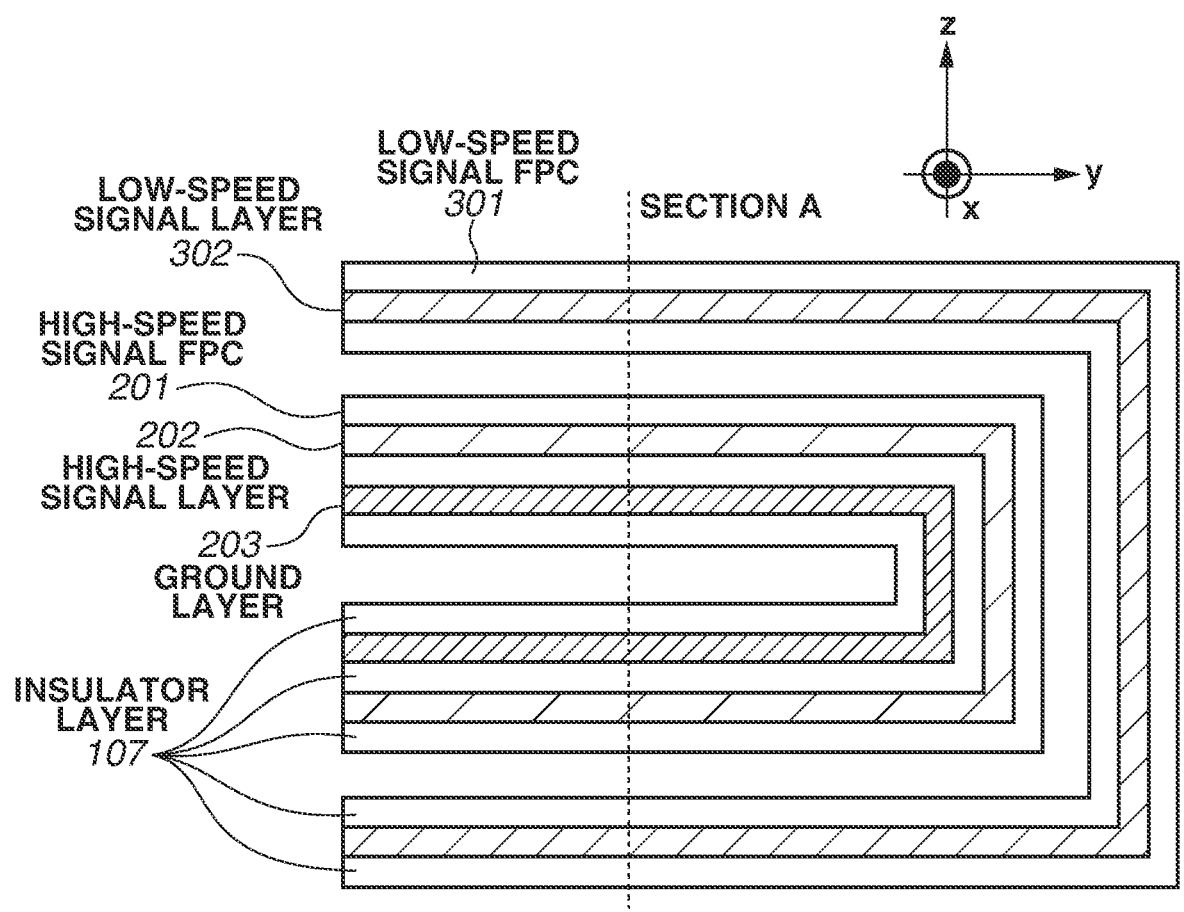
FIG. 13 is a layer configuration diagram of the FPCs according to the first exemplary embodiment.

FIG. 13 is a sectional view of FIG. 12 taken along the yz plane, seen in the x-axis direction. A layer structure will be described with reference to FIG. 13. The low-speed signal FPC 301 is a single layer FPC including one conductor layer. In FIG. 12, a low-speed signal layer 302 refers to a conductor layer that includes only low-speed signal lines different from the electrical signal lines having the highest speed among those of the electrical signals to be transmitted by the FPC 104. The high-speed signal FPC 201 is a two-layer FPC including two conductor layers. The conductor layers of the high-speed signal FPC 201 are configured in such a manner that a high-speed signal layer 202 is on the outer side of the U shape and a ground layer 203 is on the inner side. The high-speed signal layer 202 refers to a conductor layer that includes the electrical signal lines having the highest speed among those of the electrical signals to be transmitted by the FPC 104. Other signal lines and power supply lines may be laid alongside. The ground layer 203 is a wiring layer including a ground line. The ground layer 203 provides ground wiring so as to overlap the high-speed signal lines.

With such a structure, the high-speed signal layer 202 lying in the center of the U shape is shielded from both sides by the ground layer 203 and the low-speed signal layer 302. As a result, electromagnetic interference (EMI) characteristics are improved.

Next, insulator layers 107 will be described. The insulator layers 107 are layers for electrically separating the conductor layers. The insulator layers 107 are made of an insulator such as polyimide. The low-speed signal layer 302, the high-speed signal layer 202, and the ground layer 203 are thereby electrically separated. An adhesive is used to physically connect the insulator, such as polyimide, with the conductors. A description of the adhesive will be omitted since the adhesive is included in insulators (in the case of a conductive adhesive, conductors). High-flex rolled copper foil can be used as the conductors of the conductor layers for enhanced bending durability. Electrolytic copper foil, special electrolytic copper foil, or rolled copper foil may be used for portions that is subjected to less bending or sliding.

<Wiring Structure of FPC>

Figure 14:
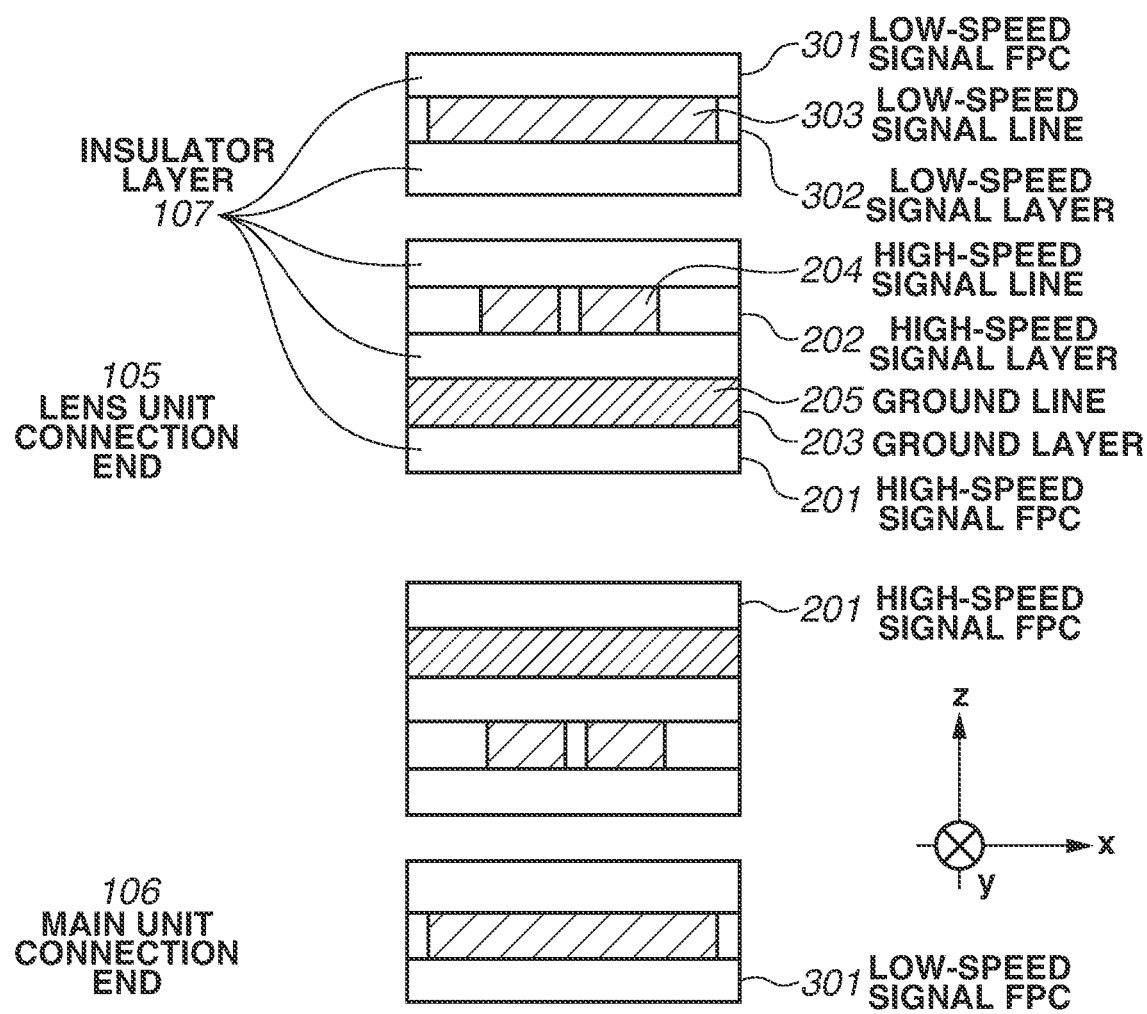
FIG. 14 is a wiring structure diagram of the FPCs according to the first exemplary embodiment.

FIG. 14 is a sectional view of FIG. 12 taken along the xz plane, seen in the y-axis direction (section A of FIG. 13). A wiring structure of the FPC 104 will be described with reference to FIG. 14. First, the wiring structure of each conductor layer will be described. High-speed signal lines 204 such as a video signal line are laid in the high-speed signal layer 202. A ground line 205 like a mesh ground is laid over the entire ground layer 203. A low-speed signal line 303 such a driving signal line of an autofocus (AF) motor for AF driving is laid in the low-speed signal layer 302.

The overlapping of the wiring of the layers will be described. The ground layer 203 provides ground wiring overlapped to cover the inner side of the high-speed signal lines 204 of the high-speed signal layer 202 in the z-axis direction. The low-speed signal layer 302 similarly provides wiring overlapped to cover the outer side of the high-speed signal lines 204 in the z-axis direction. In such a manner, the high-speed signal lines 204 can be efficiently shielded.

There may be a plurality of high-speed signal lines 204, not just one. All the high-speed signal lines 204 desirably are laid next to each other and covered with the ground line 205 and the low-speed signal line 303. In view of EMI shielding, the ground line 205 desirably covers the entire surface of the ground layer 203 to provide a wide shielding surface. However, the ground line 205 may be laid only in areas overlapping the high-speed signal lines 204. If the ground line 205 is laid only in areas overlapping the high-speed signal lines 204 in the ground layer 203, low-speed signal lines different from the ground line 205 may be laid in the remaining space in the ground layer 203. The ground line 205 may have gaps like meshes and slits. The ground line 205 may be a gapless one like a solid ground. If the ground layer 203 includes gaps as described above, the conductor volume decreases to soften the FPC 104. As a result, durability thereof is improved.

Figure 15:
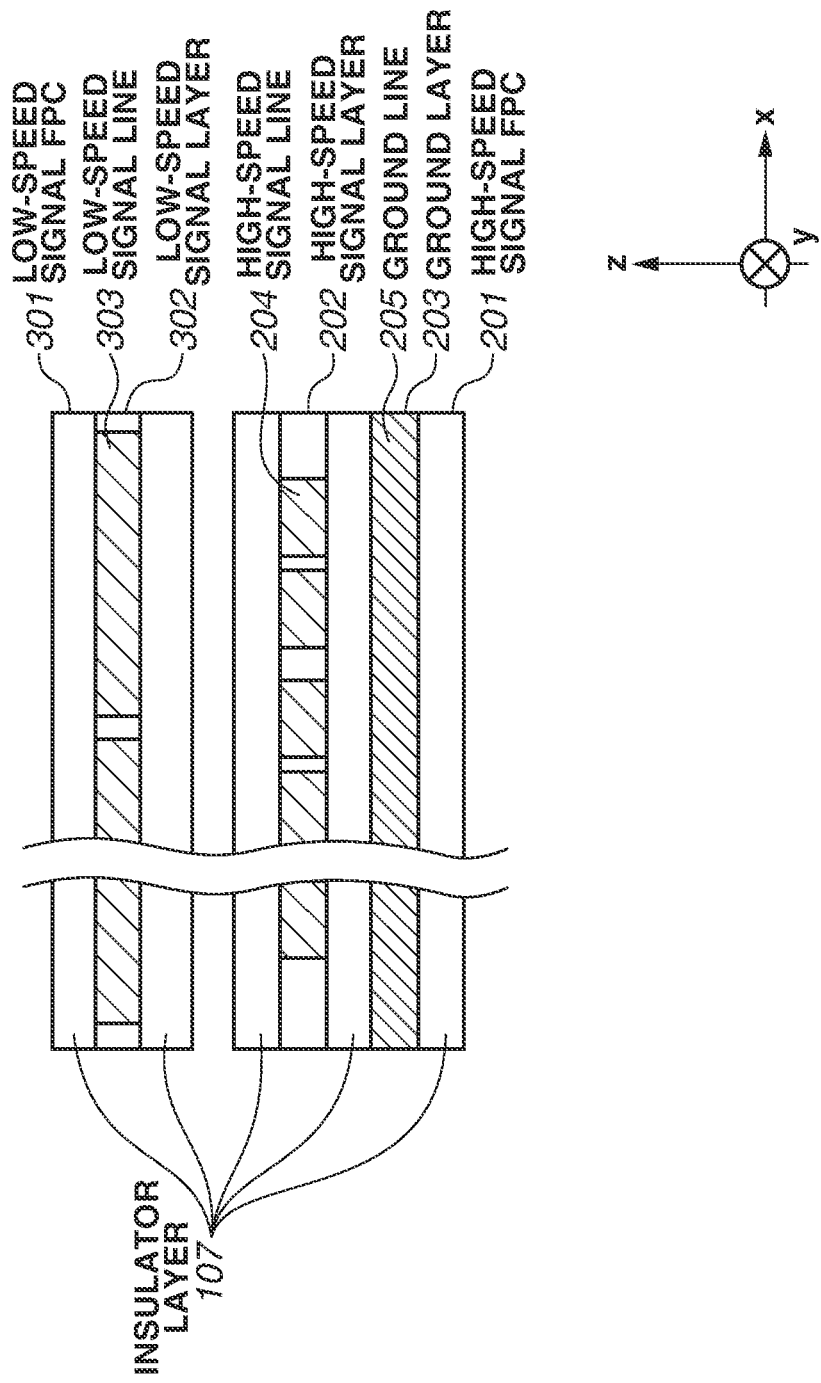
FIG. 15 is a wiring structure diagram illustrating multi-line wiring of the FPCs according to the first exemplary embodiment.

FIG. 15 illustrates a configuration in which the high-speed signal lines 204 are covered with a plurality of low-speed signal lines 303. In view of EMI shielding, a low-speed signal line 303 is desirably laid by using a line thick enough to cover the high-speed signal lines 204. A plurality of low-speed signal lines 303 may be laid, not just one. If a plurality of low-speed signal lines 303 is used for shielding, the smaller the line-to-line interval, the higher the shielding characteristic.

The principle and effect of shielding the high-speed signal lines 204 by the low-speed signal lines 303 will be described. Driving signal lines (several tens of kilohertz band) of an AF motor, having a sufficiently low frequency with respect to that of the high-speed signal lines 204 (several hundreds of megahertz band), are used as the low-speed signal lines 303. With this configuration, as seen from the high-speed signal lines 204, the low-speed signal lines 303 are equivalent to a direct-current (DC) potential, which enables EMI shielding. In other words, the low-speed signal FPC 301 itself has the function of suppressing noise of the high-speed signal FPC 201. As a result, noise can thus be suppressed without the addition of a dedicated noise suppression member to the high-speed signal lines 204.

<High-Speed Signal FPC>

The communication speed of the high-speed signal lines 204 will be described. A lens unit 102 and a main unit 103 communicate a large amount of video data at 500 Mbps. Other transmission signals, including high-frequency integrated circuit (IC) clock (CLK) and synchronization signals, have frequencies of not higher than 100 MHz. The video signal can be said to have the highest frequency. However, the high-speed signal lines 204 are not limited to video signals. For example, if the IC CLK has the highest frequency, the IC CLK is transmitted by a high-speed signal line 204. Note that the numerical values are merely examples and not restrictive.

Figure 16:
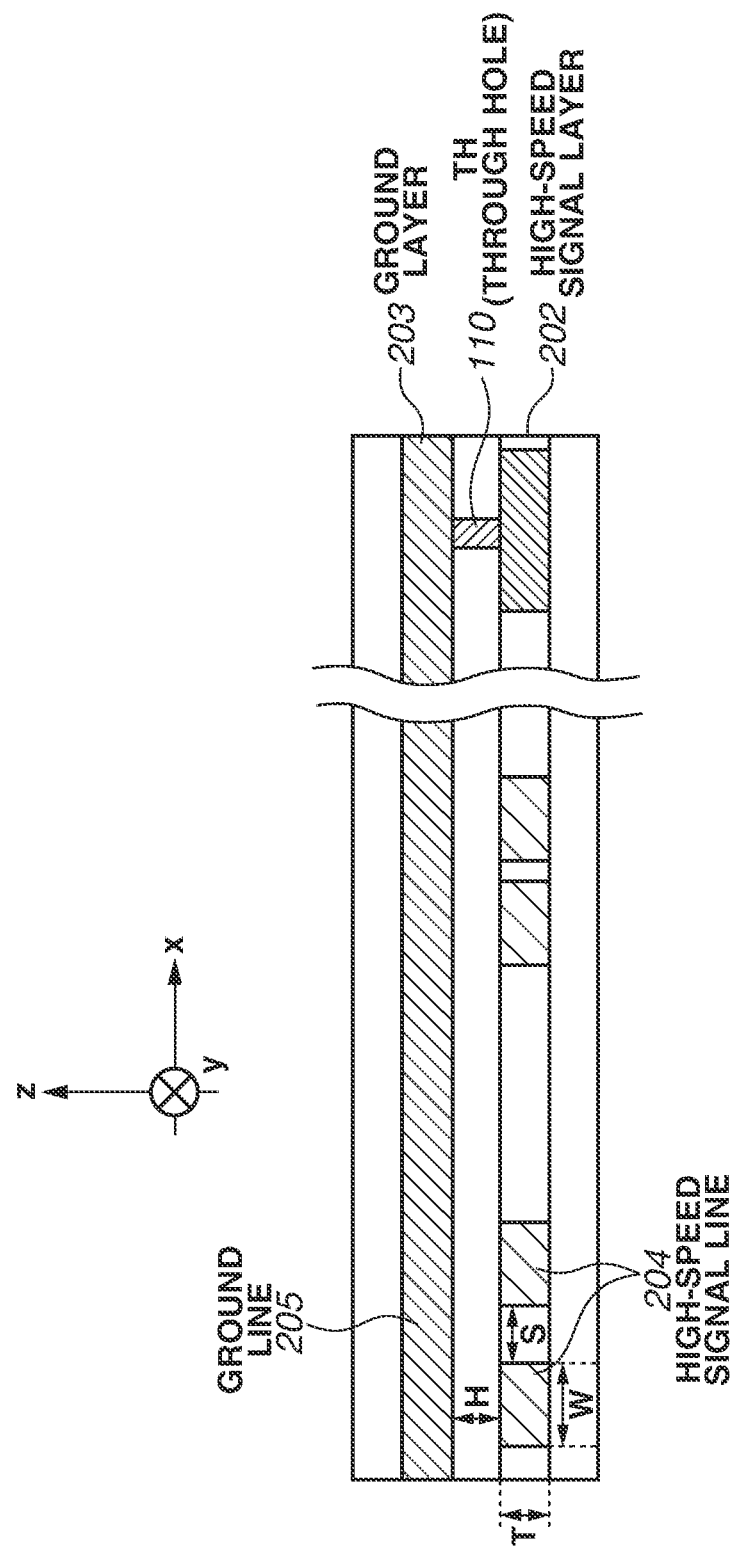
FIG. 16 is a detailed wiring structure diagram of a high-speed signal FPC according to the first exemplary embodiment.

The wiring of the high-speed signal lines 204 will be described. FIG. 16 is a detailed wiring structure diagram of the high-speed signal FPC 201. The video signal is transmitted by a transmission method such as low voltage differential signaling (LVDS), using at least a differential pair of lines. Such a method often performs parallel transmission, in which case a plurality (ten pairs or so) of high-speed signal lines 204 is used. The high-speed signals of such a differential configuration suppress signal reflection to improve transmission path characteristics and EMI characteristics through matching of characteristic impedances of the transmission lines. Combined with the ground layer 203, the high-speed signal lines 204 form coplanar lines, of which a differential characteristic impedance (Zdiff) can be derived by formulas (1) and (2):

$$Z\text{diff} = 2 * Z_0 * (1 - 0.48 * \exp(-0.96 * S/H)), \text{ and} \quad (1)$$

$$Z_0=60/\sqrt{0.475*\varepsilon r+0.67}*\ln(4*H/(0.67*(0.8*W+T))), \quad (2)$$

where S is the interval between strip lines, W is the width of the signal lines, T is the thickness of the signal lines, H is the distance between the signal lines and the ground line 205, and εr is the dielectric constant of the dielectric.

Methods for determining the parameters (T, H, W, and S) and tradeoffs will be described by using an example. First, the metal thickness T will be described. The metal thickness T of a signal line can be appropriately selected from among 9 µm, 12 µm, 18 µm, and 35 µm which are the thicknesses of typical materials. Concerning the metal thickness T, there is a tradeoff between a resistance component and hardness of the signal line. If the metal thickness T is increased to increase the sectional area W*T of the signal line, the resistance component decreases and signal quality improves. However, as the metal thickness T increases, the FPC itself becomes harder and the bendability deteriorates. The metal thickness T can be determined based on the needed signal quality and bendability.

Next, the distance H between the signal lines and the ground line 205 will be described. The distance H between the signal lines and the ground line 205 is a parameter for setting the characteristic impedance Zdiff to a desired value. Concerning the distance H, there is a tradeoff between the signal quality and the EMI characteristic. Since the characteristic impedance Zdiff decreases as the metal thickness T increases, the distance H between the signal lines and the ground line 205 needs to be increased accordingly so that the characteristic impedance Zdiff has a desired value. The distance H typically is 6 µm to 35 µm. If the distance H is increased, the coupling capacitance between the signal lines and the ground layer 203 decreases and the pass characteristic of high frequency components improves. However, the EMI characteristic deteriorates as the coupling capacitance between the signal lines and the ground line 205 decreases. To achieve a desired characteristic impedance Zdiff, the distance H between the signal lines and the ground line 205 can be determined in consideration of the needed signal quality and EMI characteristic.

The width W and the interval S of the signal lines will be described. The width W of a signal line is a parameter for setting the characteristic impedance Zdiff to a desired value. Concerning the width W, there is a tradeoff between the signal quality and layout (FPC width). From formulas (1) and (2), the width W is calculated so as to provide a desired characteristic impedance Zdiff. Since the width W affects the sectional area W*T of the signal line, the resistance component of the signal line can be reduced by increasing the width W. The greater the width W, the greater the FPC width. The width W can thus be determined in consideration of the signal quality and layout. The interval S between the strip lines is a parameter for setting the characteristic impedance Zdiff to a desired value. From the formulas (1) and (2), the interval S is calculated to provide a desired characteristic impedance Zdiff. The greater the interval S, the greater the FPC width. Thus, layout needs to be taken into consideration. Since the interval S between the signal lines of a differential signal also affects the signal quality and EMI characteristic, attention is needed not to make the interval S extremely small or large. In such a manner, the parameters (T, H, W, and S) can be determined to meet the constraints on the EMI characteristic, signal quality characteristic, bending characteristic, and layout of the imaging apparatus.

Next, a method for connecting the ground layer 203 will be described. If a two-layer FPC is used, a through hole (TH) 110 is formed between the high-speed signal layer (surface conductor layer) 202 and the ground layer (backside conductor layer) 203 to connect conductors of the high-speed signal layer 202 and the ground layer 203. This can make the ground of the high-speed signal layer 202 and the ground layer 203 the same in potential.

While the TH 110 is described to be used for ground connection, an opening may be made in the surface insulator layer to expose the conductor layer if the high-speed signal FPC 201 has no TH 110. The exposed conductor layer then can be connected to metal of ground potential. The forming method of the ground layer 203 is not limited to that of a two-sided FPC including an overlap of two single layer FPCs. Instead, a conductive sheet or conductive film generated by silver deposition or copper rolling may be attached to a single layer FPC. In such a case, the ground wiring portion of the single layer FPC is exposed, and the exposed ground wiring and the conductor portion of the conductive sheet is desirably connected by a conductive adhesive.

Figure 17:
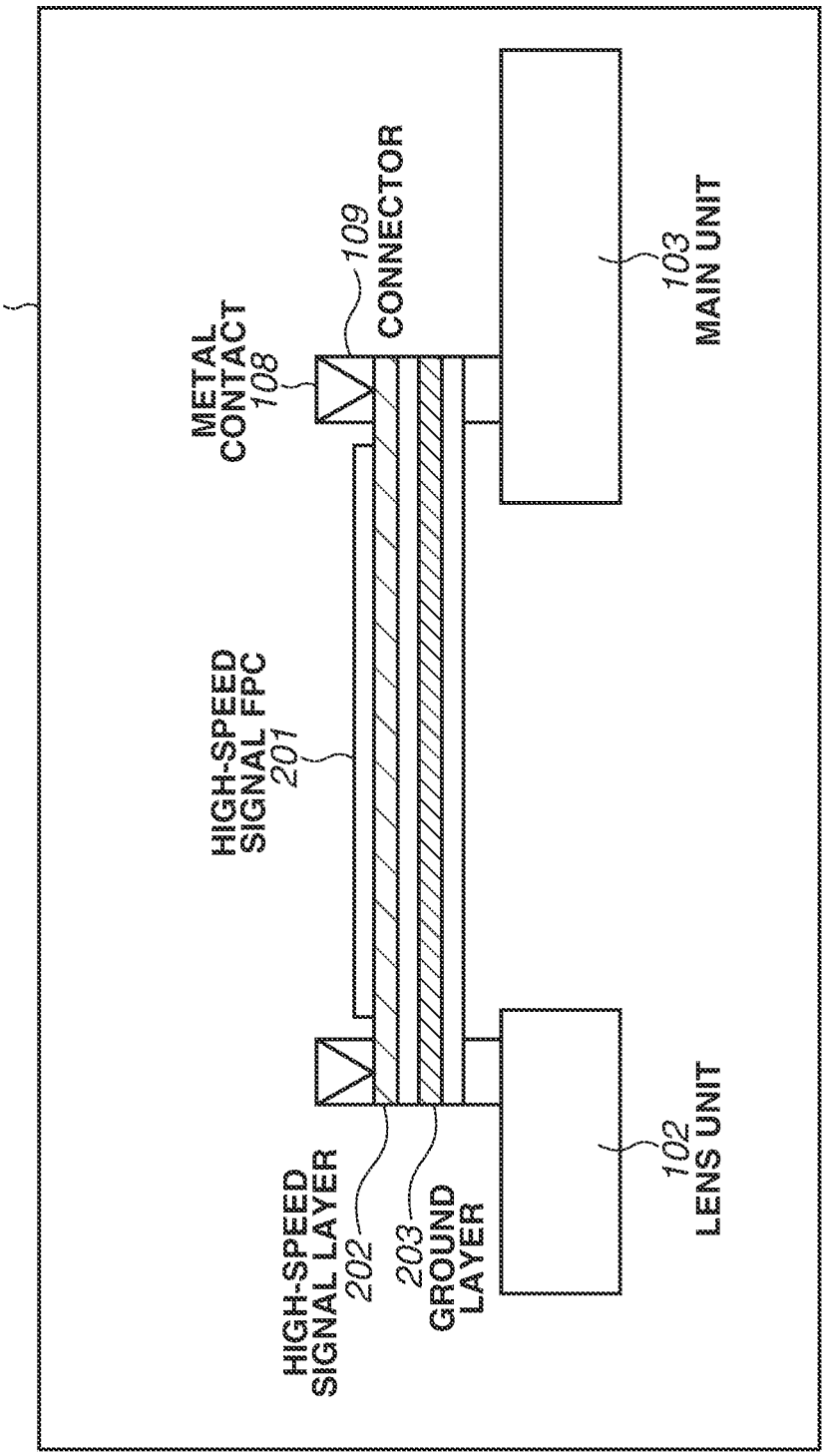
FIG. 17 is a diagram illustrating a method for connecting the high-speed signal FPC according to the first exemplary embodiment.

FIG. 17 is a connection diagram of the high-speed signal FPC 201. A method for connecting the high-speed signal lines 202 to each unit will be described with reference to FIG. 17. FIG. 17 illustrates an imaging apparatus 101 in which the high-speed signal FPC 201 is connected to the lens unit 102 (which refers to a unit similar to the lens unit 61 of FIG. 1) and the main unit 103 (which refers to a unit similar to the electric substrate 44 of FIG. 1). For the connection terminals, connectors 109 conforming to the high-speed signal FPC 201 are installed on the electric substrates of the respective units. Processing for removing insulation portions of the high-speed signal FPC 201 is performed so that the high-speed signal layer 202 makes contact with metal contacts 108 of the connectors 109. It is preferable to perform plating on the conductor portions to prevent oxidation. If connectors are not installable, the electric substrates and the high-speed signal FPC 201 may be connected by screwing or soldering.

<Low-Speed Signal FPC>

Figure 18:
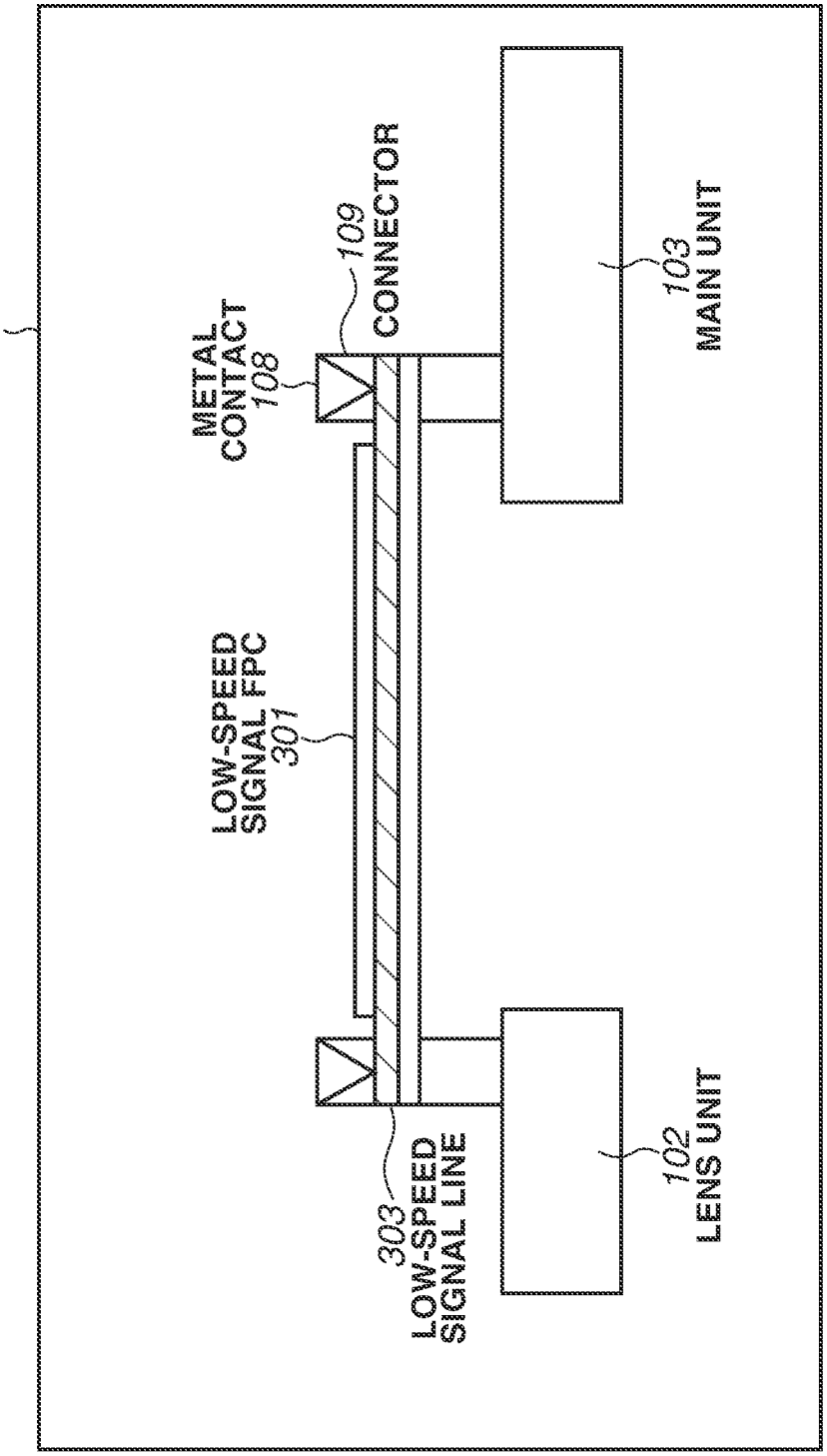
FIG. 18 is a diagram illustrating a method for connecting a low-speed signal FPC according to the first exemplary embodiment.

FIG. 18 is a connection diagram of the low-speed signal FPC 301. A method for connecting the low-speed signal lines 303 to each unit will be described with reference to FIG. 18. In the imaging apparatus 101 of FIG. 18, like the high-speed signal FPC 201, the low-speed signal FPC 301 is connected to the lens unit 102 and the main unit 103 via metal contacts 108 of connectors 109.

The connection method is not limited to connectors. Screwing or soldering may be employed.

The low-speed signal lines 303 are not limited to the driving signal lines of an AF motor, and may include any line of frequency lower than that of the high-speed signal lines 204. Examples include lines of a synchronization signal, a control signal, and a power supply voltage, driving signal lines different from those of an AF motor, and analog lines of a thermistor.

While the low-speed signal FPC 301 is described to be one in number, there may be a plurality of low-speed signal FPCs 301. In such a case, the low-speed signal lines may be desirably arranged on the outer side of the U shape.

Figure 6:
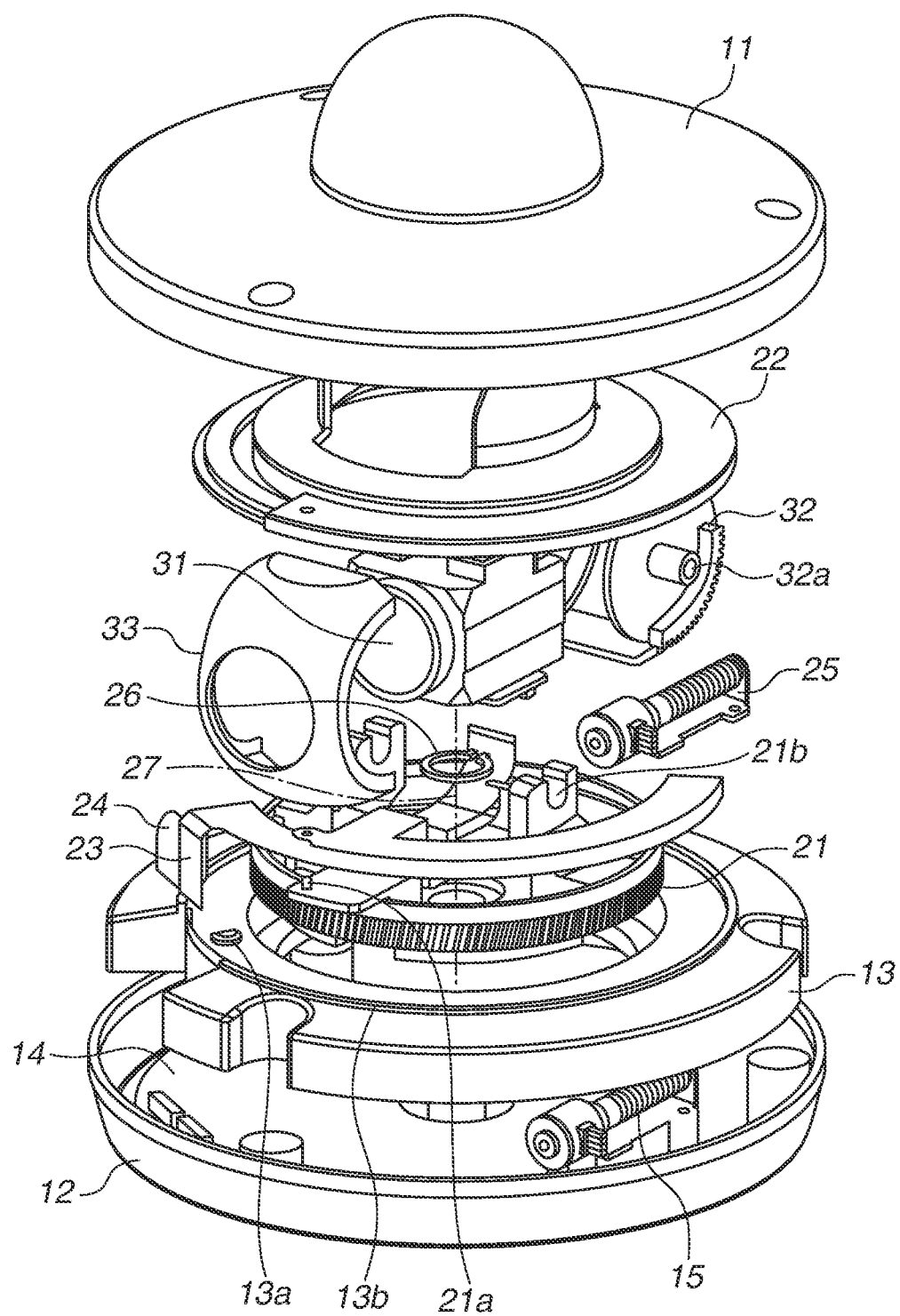
FIG. 6 is an exploded view of a pan tilt camera according to a second exemplary embodiment.

Next, a second exemplary embodiment of the present invention will be described. FIG. 6 is an exploded view of a pan tilt camera according to the present exemplary embodiment. An electric substrate 14 and a motor unit 15 are attached to a bottom case 12. An inner case 13 is integrally attached to the bottom case 12. The bottom case 12, the inner case 13, the electric substrate 14, and the motor unit 15 constitute a non-rotating unit.

A pan rotation table 21 is fitted to a protruding portion (not illustrated) at the center of the bottom case 12, and attached to the bottom case 12 by a stop ring 26 to be rotatable in a pan direction. A pan rotation table 21 includes a helical gear. The pan rotation table 21 is driven to rotate in the pan direction by driving a worm gear of a motor unit 15. An FPC 24 for controlling a lens unit 31 and an FPC 23 for transmitting an imaging signal from the lens unit 31 are attached to the inner case 13.

Figure 7:
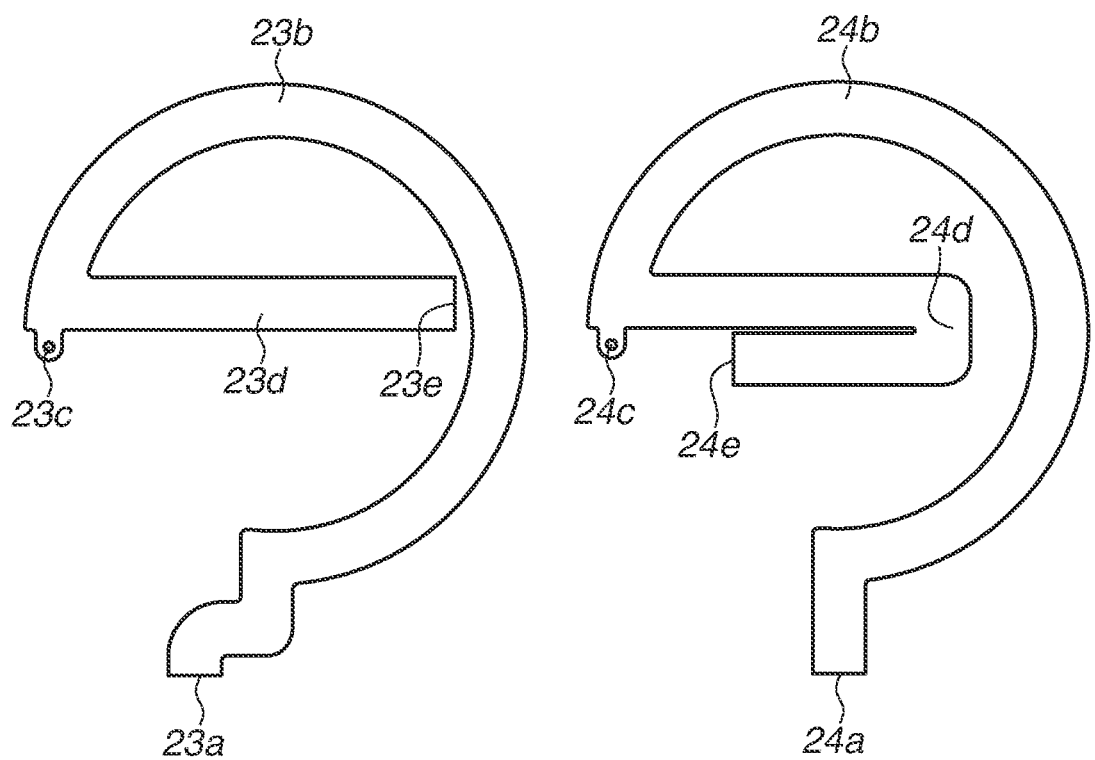
FIG. 7 is a developed configuration diagram of flexible printed circuits according to the second exemplary embodiment.
Figure 8:
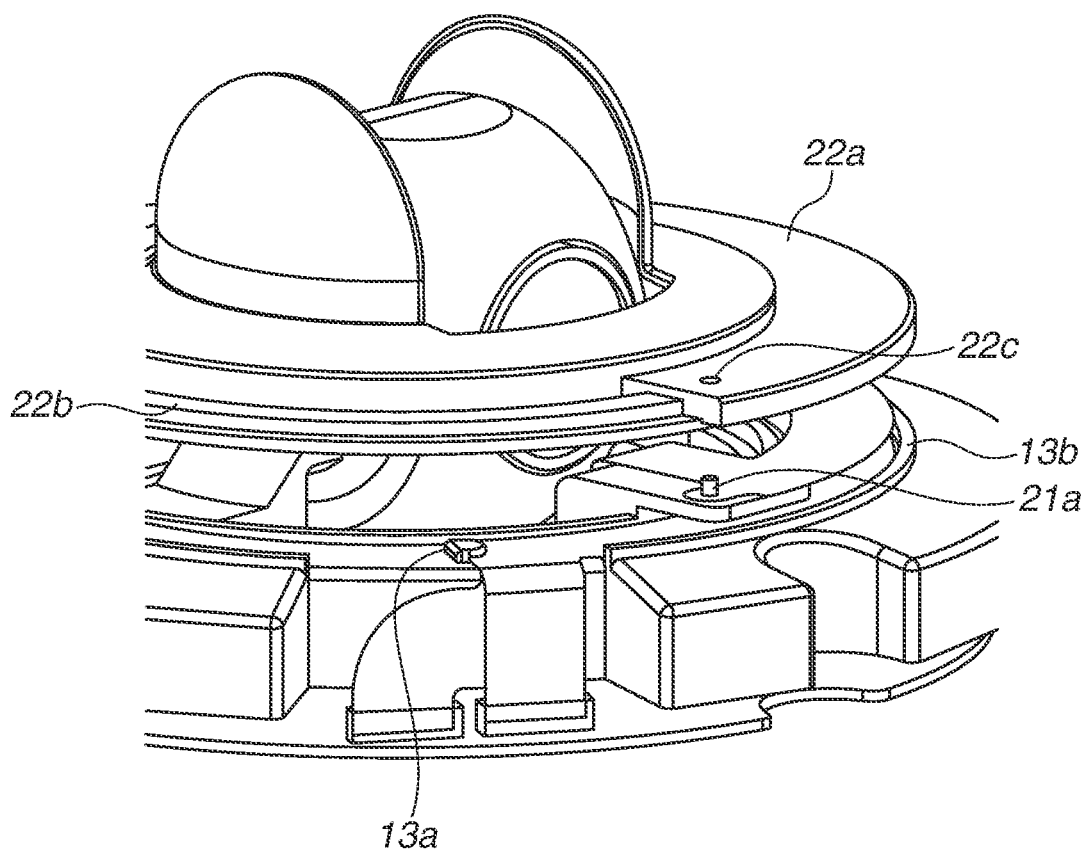
FIG. 8 is a detailed assembly diagram of the flexible printed circuits according to the second exemplary embodiment.

FIG. 7 illustrates a developed configuration diagram of the FPCs 23 and 24 according to the present exemplary embodiment. FIG. 8 illustrates a detailed assembly diagram of the FPCs 23 and 24 according to the present exemplary embodiment. Terminal portions 23a and 24a of the FPCs 23 and 24 are connector-connected and fixed to the electric substrate 14. The FPCs 23 and 24 include arc-shaped first portions 23b and 24b, which are coaxial with a pan rotation axis. The arc-shaped first portions 23b and 24b are arranged on a surface perpendicular to the pan rotation axis.

The inner case 13 includes a hook portion 13a for fixing the FPCs 23 and 24 so that the FPCs 23 and 24 will not lift in the direction of the pan rotation axis during a pan rotation. The inner case 13 further includes a protrusion 13b for guiding the arc-shaped first portions 23b and 24b so as to prevent the arc-shaped first portions 23b and 24b from shifting in a direction perpendicular to the pan rotation axis. The protrusion 13b is arranged substantially around the entire circumference except where the FPCs 23 and 24 are fixed to the electric substrate 14. With this configuration, the arc-shaped first portions 23b and 24b can be constantly maintained coaxial with the pan rotation axis.

The pan rotation table 21 includes a protruding portion 21a, which is pressed and fitted into fixing holes 23c and 24c of the FPCs 23 and 24. The FPCs 23 and 24 are fixed in such a manner that the arc-shaped first portions 23b and 24b are bent around an axis orthogonal to the pan rotation axis.

Figure 9:
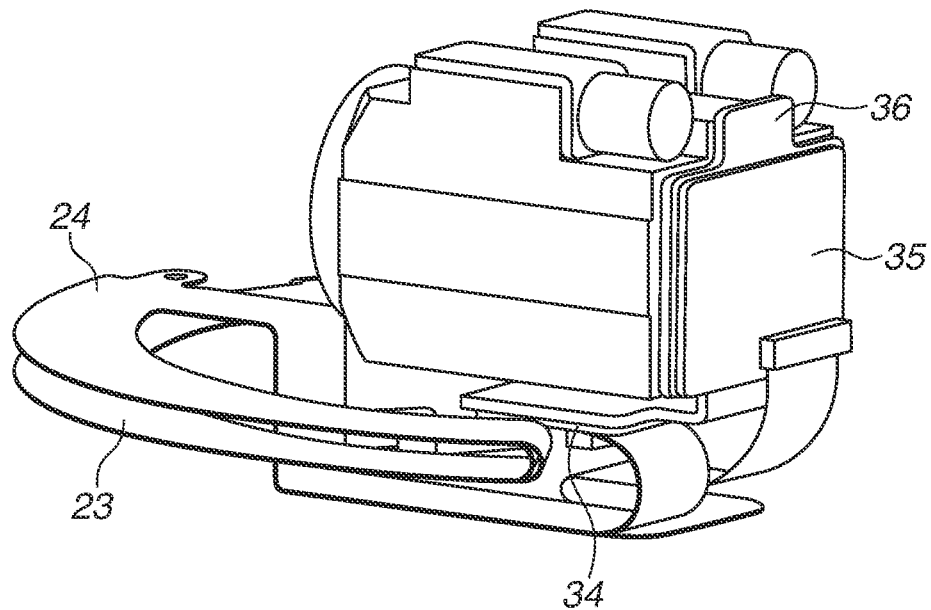
FIG. 9 is a diagram illustrating bending of the flexible printed circuits according to the second exemplary embodiment.

FIG. 9 is a diagram illustrating the bending of the FPCs 23 and 24 according to the present exemplary embodiment. The FPC 23 is arranged on the upper side of the inner case 13 with the FPC 24 therebetween. Thus, when the arc-shaped first portions 23b and 24b are bent, the FPC 23 is arranged inside the FPC 24. The arc-shaped first portions 23b and 24b need to be bent around respective different axes orthogonal to the pan rotation axis so that the bending position of the FPC 23 always lies in front of that of the FPC 24. If the bending position of the FPC 23 coincides with or comes behind that of the FPC 24, the bending positions fail to slide over the arc shape due to the occurrence of interference.

If a plurality of FPCs is configured to be overlapped in such a manner, the bending axes perpendicular to the pan rotation axis can be made different by configuring the arc-shaped first portion 23b to be shorter than the arc-shaped first portion 24b. Alternatively, if the FPCs 23 and 24 are formed to have the same shape, the bending axes can be made different by overlapping the FPCs 23 and 24 in different positions on the same axis of the arc shape. In such a case, the hook portion 13a of the inner case 13 and the protruding portion 21a of the pan rotation table 21 need to be provided for each of the FPCs 23 and 24 separately.

In the present exemplary embodiment described above, the imaging apparatus includes two FPCs 23 and 24. If the lens unit 31 does not need to be controlled, the imaging apparatus may include only the FPC 24 for transmitting the imaging signal.

FIGS. 10A to 10C are shape change diagrams of the FPCs 23 and 24 during a pan rotation according to the present exemplary embodiment. FIG. 10A illustrates the shape of the FPCs 23 and 24 when the pan rotation table 21 is panned to the maximum counterclockwise. The bending positions of the first portions 23b and 24b come closest to the protruding portion 21a of the pan rotation table 21. FIG. 10B illustrates the shape of the FPCs 23 and 24 in an intermediate position of pan rotation. The bending positions slide over the arc shape by the amount of movement always one half that of the pan rotation. FIG. 10C illustrates the shape of the FPCs 23 and 24 when the pan rotation table 21 is panned to the maximum clockwise. The FPCs 23 and 24 fixed to the protruding portion 21a of the pan rotation table 21 pass over the ends of the arc-shaped first portions 23b and 24b fixed to the hook portion 13a of the inner case 13 and move onto the extended circle of the arc-shaped first portions 23b and 24b.

An inner cover 22 is integrally attached to the pan rotation table 21. The inner cover 22 includes a groove 22a for guiding the folding portions when the arc-shaped first portions 23b and 24b of the FPCs 23 and 24 are bent. The inner cover 22 further includes a retaining shape 22b for preventing the FPCs 23 and 24 fixed to the inner case 13 from lifting. The retaining shape 22b is formed in an area where the folding portions will not reach when the arc-shaped first portions 23b and 24b are bent. The inner cover 22 further includes a hole 22c. The protruding portion 21a of the pan rotation table 21, running through the fixing holes 23c and 24c of the FPCs 23 and 24, is fitted to the hole 22c, whereby the FPCs 23 and 24 are prevented from coming off from the protruding portion 21a.

The inner cover 22 and the inner case 13 are configured to cover the arc-shaped first portions 23b and 24b of the FPCs 23 and 24. Noise of the FPCs 23 and 24 can be suppressed by forming both or at least one of the inner cover 22 and the inner case 13 with resin having an electromagnetic shielding property.

A front cover 33 and a tilt rotation case 32 are attached to the lens unit 31. The tilt rotation case 32 includes a tilt rotation shaft 32a, which is fitted to and supported by a bearing portion 21b arranged on the pan rotation table 21. The tilt rotation case 32 includes a helical gear. By driving a worm gear of a motor unit 25 fixed to the pan rotation table 21, the tilt rotation case 32 can be driven to rotate in a tilt direction. As illustrated in FIG. 9, a lens substrate 34, an imaging substrate 35, and a lens plate 36 are attached to the lens unit 31. The lens substrate 34 controls the lens unit 31. An image sensor is mounted on the imaging substrate 35. The lens plate 36 supports the lens substrate 34 and the imaging substrate 35.

As illustrated in FIG. 7, the FPC 23 includes a straight portion 23d extending inward from the end of the arc-shaped first portion 23b. The straight portion 23d of the FPC 23 is bent in parallel with the tilt rotation axis, and a terminal portion 23e is fixed and connected to the lens substrate 34. The FPC 24 includes a U-shaped portion 24d which extends inward from the end of the arc-shaped first portion 24b, makes a U-turn, and extends outward. The outward straight shape of the U-shaped portion 24d of the FPC 24 is bent in parallel with the tilt rotation axis, and a terminal portion 24e is fixed and connected to the imaging substrate 35.

FIGS. 11A and 11B are shape change diagrams of the FPCs 23 and 24 during a tilt rotation according to the present exemplary embodiment. FIG. 11A illustrates the shape of the FPCs 23 and 24 when the lens optical axis of the lens unit 31 is horizontally directed. FIG. 11B illustrates the shape of the FPCs 23 and 24 when the lens optical axis of the lens unit 31 is vertically directed. The bending positions slide over the straight portion 23d by the amount of movement always one half that of the tilt rotation. The bending positions of the straight portion 23d and the U-shaped portion 24d are shifted in the planar direction and thus do not interfere with each other. Since the straight portion 23d and the U-shaped portion 24d are bent in parallel with the tilt rotation axis, the tilt rotation only produces a change of the FPCs 23 and 24, in which the bending positions slide, without a change in route or orientation of portions other than the outwardly-shaped portions. Stress on the FPCs 23 and 24 from a tilt rotation is thus limited to the range of the bending positions and to simple bending only. This improves durability.

A hole is formed in the inner cover 22 so that the lens unit 31, the front cover 33, and the tilt rotation case 32 do not interfere during a tilt rotation. A transparent hemispherical dome cover is integrally attached to a top cover 11 to enable imaging regardless of pan and tilt orientations of the lens unit 31. The top cover 11 is fixed to the bottom case 12.

With the foregoing configuration, the rotation of the rotating unit only produces a change of the FPCs 23 and 24, in which the bending positions simply slide over the arc-shaped first portions 23b and 24b. Since the portions other than the arc-shaped first portions 23b and 24b do not change in route or orientation, durability improves. Since the arc-shaped first portions 23b and 24b are bent only once, the configuration can be made small in the height direction. As seen in a plane of projection in the pan rotation axis direction, the moving range of the FPCs 23 and 24 is limited to the arc-shaped first portions 23b and 24b and their extended circle. Therefore, the configuration can also be made small in the direction of the outer diameter about the pan rotation axis.

Figure 19:
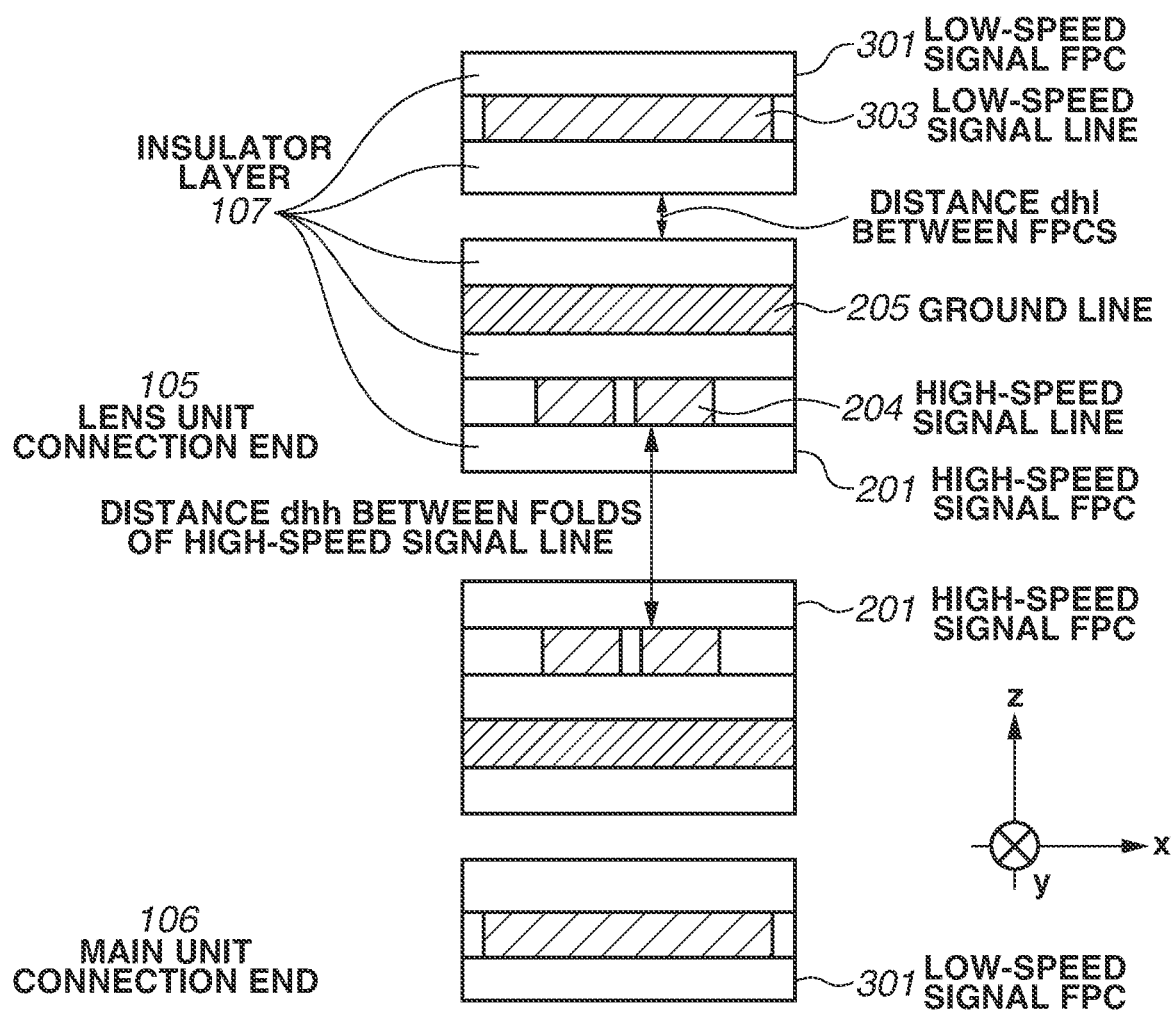
FIG. 19 is a diagram illustrating a distance between FPCs according to a third exemplary embodiment.

Next, a third exemplary embodiment of the present invention will be described below. The third exemplary embodiment deals with a case in which the high-speed signal FPC 201 of the FPC 104 according to the first exemplary embodiment is hardened. FIG. 19 illustrates a sectional view of an overlap of two FPCs similar to those of FIG. 14 (section A of FIG. 13) in a thickness direction of the FPCs.

A structure for reducing a distance dhl between the high-speed signal FPC 201 and a low-speed signal FPC 301 illustrated in FIG. 19 to improve shielding characteristics will be described. The bending radius of an FPC is determined by the hardness of the FPC. The harder the FPC, the larger the bending radius. By making high-speed signal FPC 201 harder than the low-speed signal FPC 301, the bending radius of the high-speed signal FPC 201 can be increased. By such a structure, the high-speed signal FPC 201 can be brought close to the low-speed signal FPC 301 for improved shielding characteristics. In view of EMI, the high- and low-speed signal FPCs 201 and 301 may desirably be brought so close that the surface insulators make contact with each other. However, the reduced distance can cause crosstalk, depending on signal waveforms. In such a case, it is desirable to eliminate overshoots and undershoots for crosstalk suppression by making the signal waveforms less sharp.

A method for hardening the high-speed signal FPC 201 will be described. A major factor of the hardness of an FPC is the thickness of its conductor layer(s). If the low-speed signal FPC 301 has a conductor thickness of 35 μm, the conductor thickness of the high-speed signal FPC 201 is set to be thicker than or equal to 35 μm. Since the high-speed signal FPC 201 has a two-layer structure, such a conductor thickness can be achieved by forming each layer with a conductor thickness of 18 μm.

The hardness also varies depending on the wiring area and material of the conductors, and the thickness and material of the insulators. The structure of the high- and low-speed signal FPCs 201 and 301 may be desirably determined in consideration of such factors.

Making the high-speed signal FPC 201 harder than the low-speed signal FPC 301 improves EMI characteristics. The greater the difference in hardness, the higher the effect. It is useful to harden the high-speed signal FPC 201 relative to the low-speed signal FPC 301.

Next, a fourth exemplary embodiment of the present invention will be described. A method for reducing the apparatus size by making the low-speed signal FPC 301 of the FPC 104 according to the first exemplary embodiment harder than the high-speed signal FPC 201 will be described.

First, concerning a conductor thickness, a tradeoff between electric characteristics and an apparatus size will be described. In view of the electric characteristics, by increasing the conductor thickness, resistance components can be reduced. Greater conductor thickness is therefore desirable. However, in view of the apparatus size, harder FPCs causes larger bending radii. Smaller conductor thicknesses are therefore desirable. Whether to increase or decrease the conductor thickness is therefore not simply determinable. A structure that can miniaturize the structure of the FPC 104 according to the first exemplary embodiment with the same total thickness of the conductor layers will be described.

Figure 20:
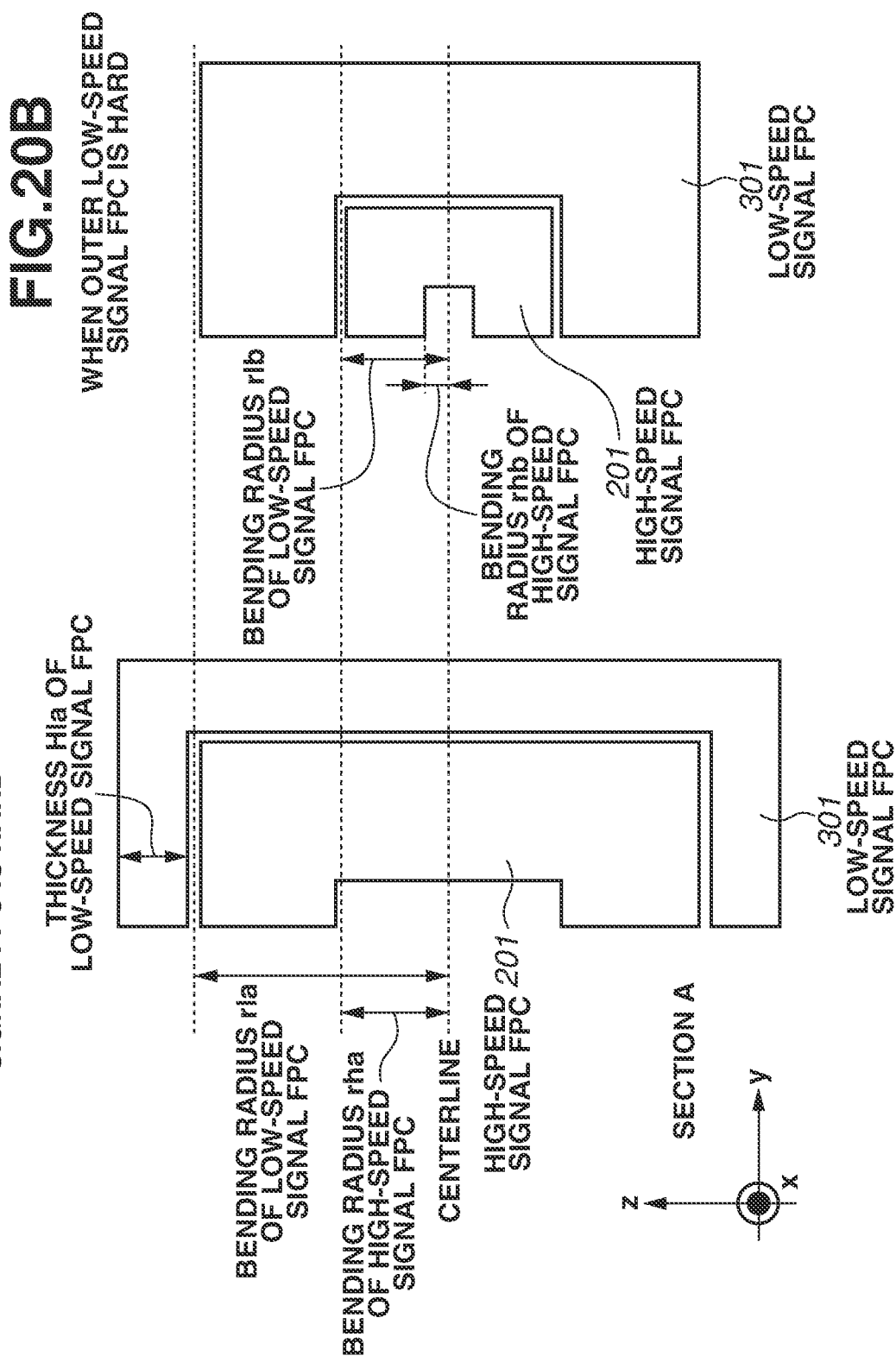
FIGS. 20A and 20B are diagrams illustrating miniaturization of FPCs according to a fourth exemplary embodiment.

FIGS. 20A and 20B are sectional views taken along the section A of FIG. 13 according to the first exemplary embodiment. FIG. 20A illustrates a case in which the high-speed signal FPC 201 is hard. FIG. 20B illustrates a case in which the low-speed signal FPC 301 is hard. In FIGS. 20A and 20B, the total thickness of all the conductor layers is the same.

As illustrated in FIG. 20A, if the inner high-speed signal FPC 201 is hard, the high-speed signal FPC 201 has a large bending radius rha. Therefore, the low-speed signal FPC 301 overlapped on the outer side has a large bending radius rla. Referring to FIG. 20B, a case in which the two FPCs 201 and 301 are reversed in hardness, i.e., the outer low-speed signal FPC 301 is hard and the inner high-speed signal FPC 201 is soft will be described. The high-speed signal FPC 201 has a bending radius rhb smaller than the bending radius rha in FIG. 20A. Since the low-speed signal FPC 301 harder than the high-speed signal FPC 201 is overlapped on the outer side, the bending radius rlb of the low-speed signal FPC 301 is determined by the hardness of the low-speed signal FPC 301 regardless of the bending radius rhb of the high-speed signal FPC 201. Therefore, bending radius rha of the high-speed signal FPC 201 in FIG. 20A coincides with the bending radius rlb of the low-speed signal FPC 301 in FIG. 20B.

A comparison between the sizes of the folding portions in FIGS. 20A and 20B shows that if the total thickness of the high- and low-speed signal FPCs 201 and 301 is the same, the folded FPCs 201 and 301 in FIG. 20A are greater by the thickness Hla of the low-speed signal FPC 301. In other words, making the outer low-speed signal FPC 301 harder than the inner high-speed signal FPC 201 enables miniaturization thereof. A single layer FPC has a thickness of approximately 0.03 to 0.12 mm. Since the U shape provides upper and lower, two strokes of reduction, an improvement of approximately 0.06 to 0.24 mm in diameter can be expected.

A specific design example will be described. If the low-speed signal FPC 301 has a conductor thickness of 35 μm, the conductor thickness of the high-speed signal FPC 201 is set to be smaller than 35 μm. Since the high-speed signal FPC 201 has a two-layer structure, such a conductor thickness can be achieved by forming each layer with a conductor thickness of 12 µm, i.e., the two layers with a conductor thickness of 24 µm.

The hardness also varies depending the wiring area and material of the conductors, and the thickness and material of the insulators. It is useful to determine the structure of the high- and low-speed signal FPCs 201 and 301 in consideration of such factors.

Making the low-speed signal FPC 301 harder than the high-speed signal FPC 201 enables miniaturization thereof. It is useful to harden the low-speed signal FPC 301 relative to the high-speed signal FPC 201.

Figure 21:
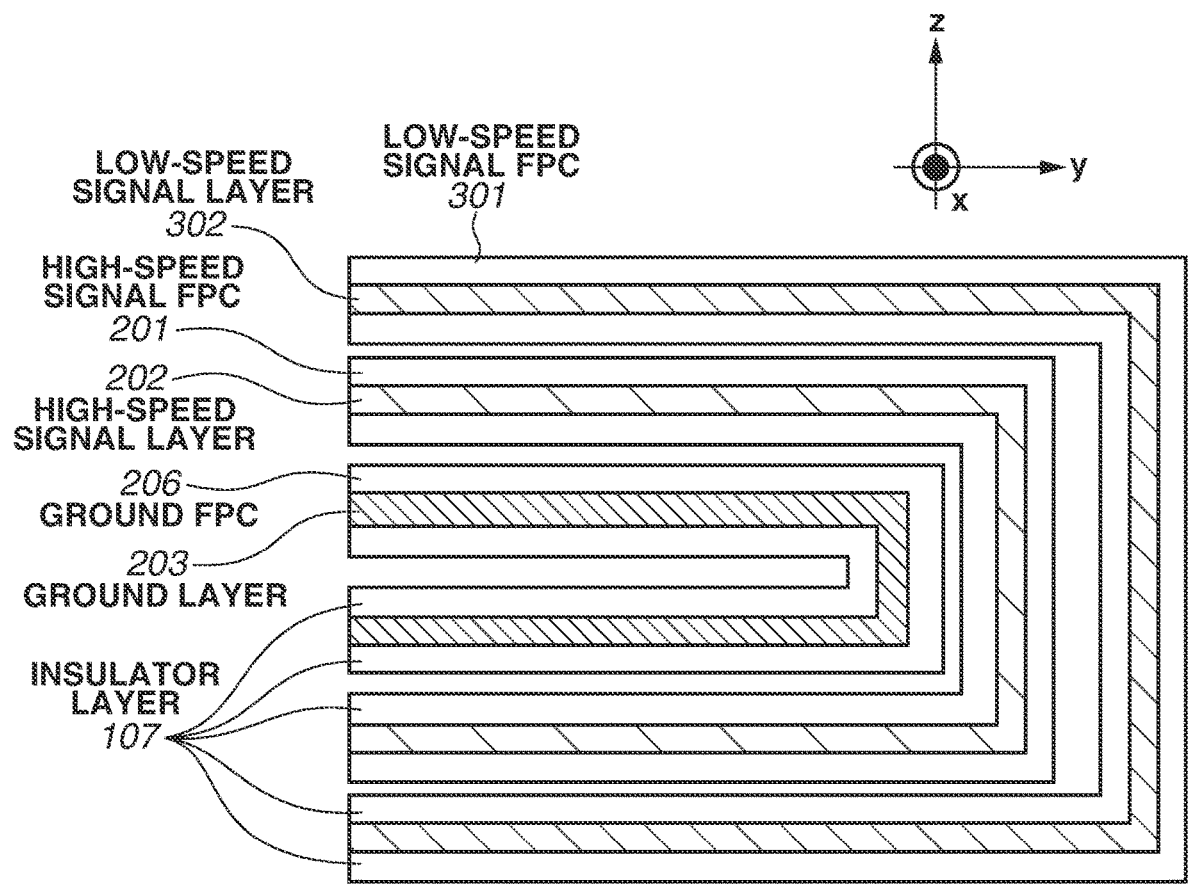
FIG. 21 is a diagram illustrating a three-part divided structure of FPCs according to a fifth exemplary embodiment.

Next, a fifth exemplary embodiment of the present invention will be described. The fifth exemplary embodiment deals with a case in which the two-layer FPC according to the first exemplary embodiment is divided into two FPCs. FIG. 21 is a sectional view illustrating a layer structure when the ground layer 203 of the high-speed signal FPC 201, which is the two-layer FPC, is separated. As illustrated in FIG. 21, all the FPCs are configured as single layer FPCs. A ground FPC 206, which is an example of a ground FPC, and the high- and low-speed signal FPCs 201 and 301 are arranged in this order from the innermost side of the U shape. Such a structure can reduce the thickness per FPC to enhance the bending durability of the FPCs.

By making the inner FPCs of the U shape hard, EMI shielding can be robust. For example, by making the innermost ground FPC 206 the hardest, and the outermost low-speed signal FPC 301 the softest, the overlapping portions of the FPCs can be brought into contact with each other. This not only provides robust EMI shielding, but also can stabilize the distances between the conductor layers for stable impedance and improved waveform quality.

Figure 22:
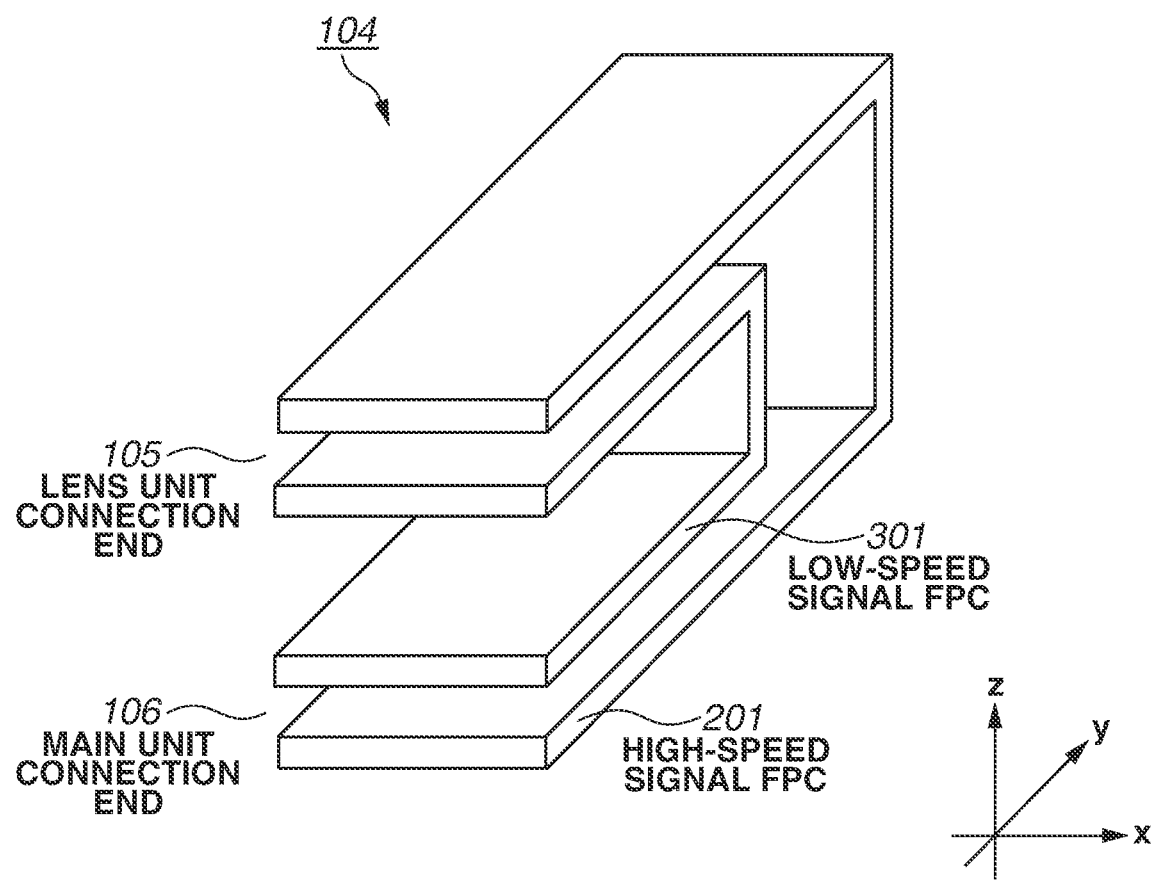
FIG. 22 is a U-shape structure diagram of FPCs according to a sixth exemplary embodiment.

FIG. 22 illustrates an overall structure of an FPC 104 according to a sixth exemplary embodiment of the present invention. In FIG. 22, the x-axis direction is a width direction of the FPC 104, the y-axis direction is a length direction of the FPC 104, and the z-axis direction is a thickness (height) direction of the FPC 104.

A high-speed signal FPC 201 and a low-speed signal FPC 301 both have a folding structure. With the folding structure, the low-speed signal FPC 301 and the high-speed signal FPC 201 have a U shape. The high- and low-speed signal FPCs 201 and 301 each have overlapping surfaces as illustrated in FIG. 22, and the folded FPCs 201 and 301 are arranged to overlap. The low-speed signal FPC 301 is thus arranged to cover the inner side of the high-speed signal FPC 201. Such a U-shaped structure allows the low-speed signal FPC 301 to absorb radio waves radiated from the high-speed signal FPC 201 inside.

Figure 23:
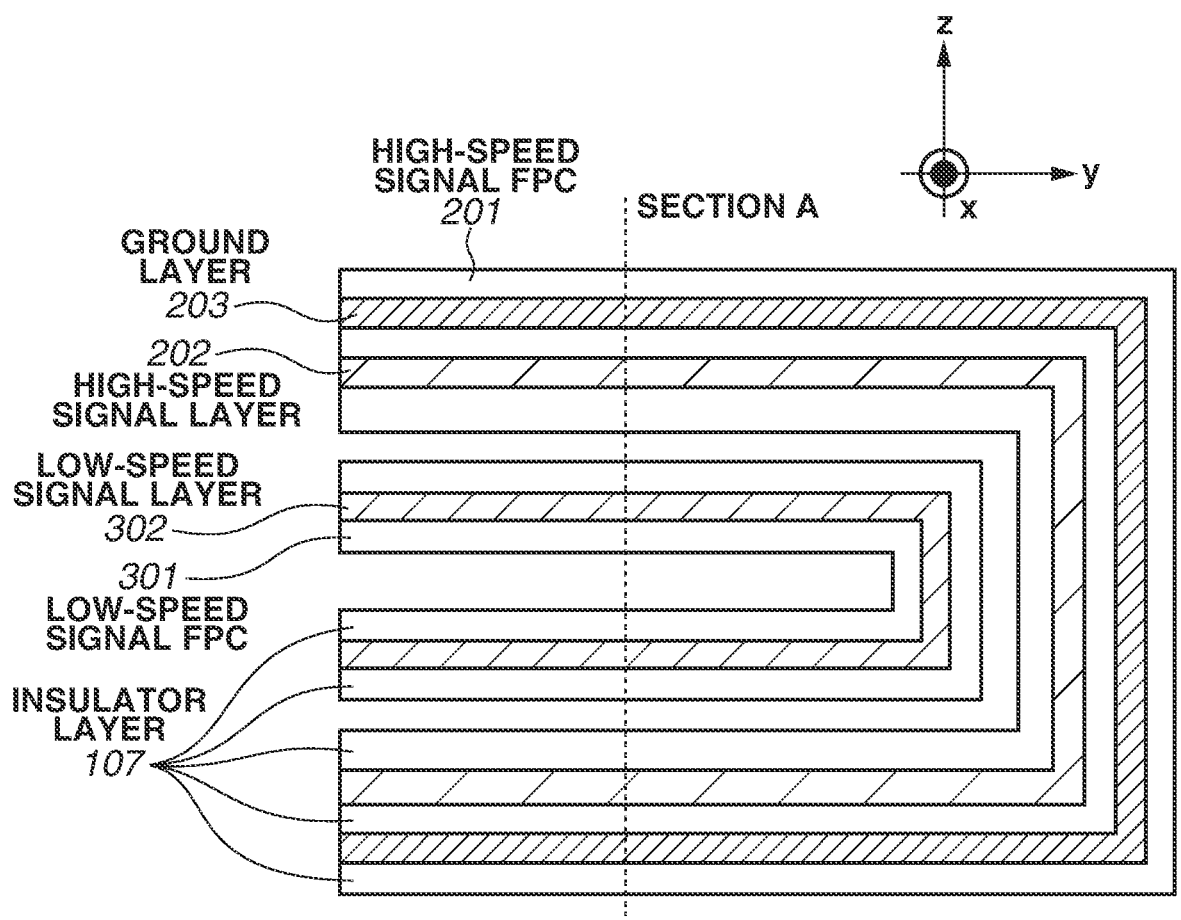
FIG. 23 is a layer configuration diagram of the FPCs according to the sixth exemplary embodiment.

FIG. 23 is a sectional view of FIG. 22 taken along the yz plane, seen in the x-axis direction. The layer configuration will be described with reference to FIG. 23. The low-speed signal FPC 301 is a single layer FPC including one conductor layer. In FIG. 23, the low-speed signal layer 302 refers to a conductor layer including only low-speed signal lines without electrical signal lines having the highest speed among those of electrical signals to be transmitted by the FPC 104. On the other hand, the high-speed signal FPC 201 is a two-layer FPC including two conductor layers. The conductor layers of the high-speed signal FPC 201 are configured in such a manner that a high-speed signal layer 202 is on the inner side of the U shape, and a ground layer 203 is on the outer side. The high-speed signal layer 202 refers to a conductor layer including the electrical signal lines having the highest speed among those of the electrical signals to be transmitted by the FPC 104. Other signal lines and power supply lines may be laid side by side. The ground layer 203 is a wiring layer including a ground line. The ground layer 203 provides ground wiring so as to overlap high-speed signal lines. With such a structure, the high-speed signal layer 202 lying in the center of the U shape is shielded from both sides by the ground layer 203 and the low-speed signal layer 302. In this way, EMI characteristics are improved. This can reduce radiated waves and enable shielding without mechanical members.

Figure 24:
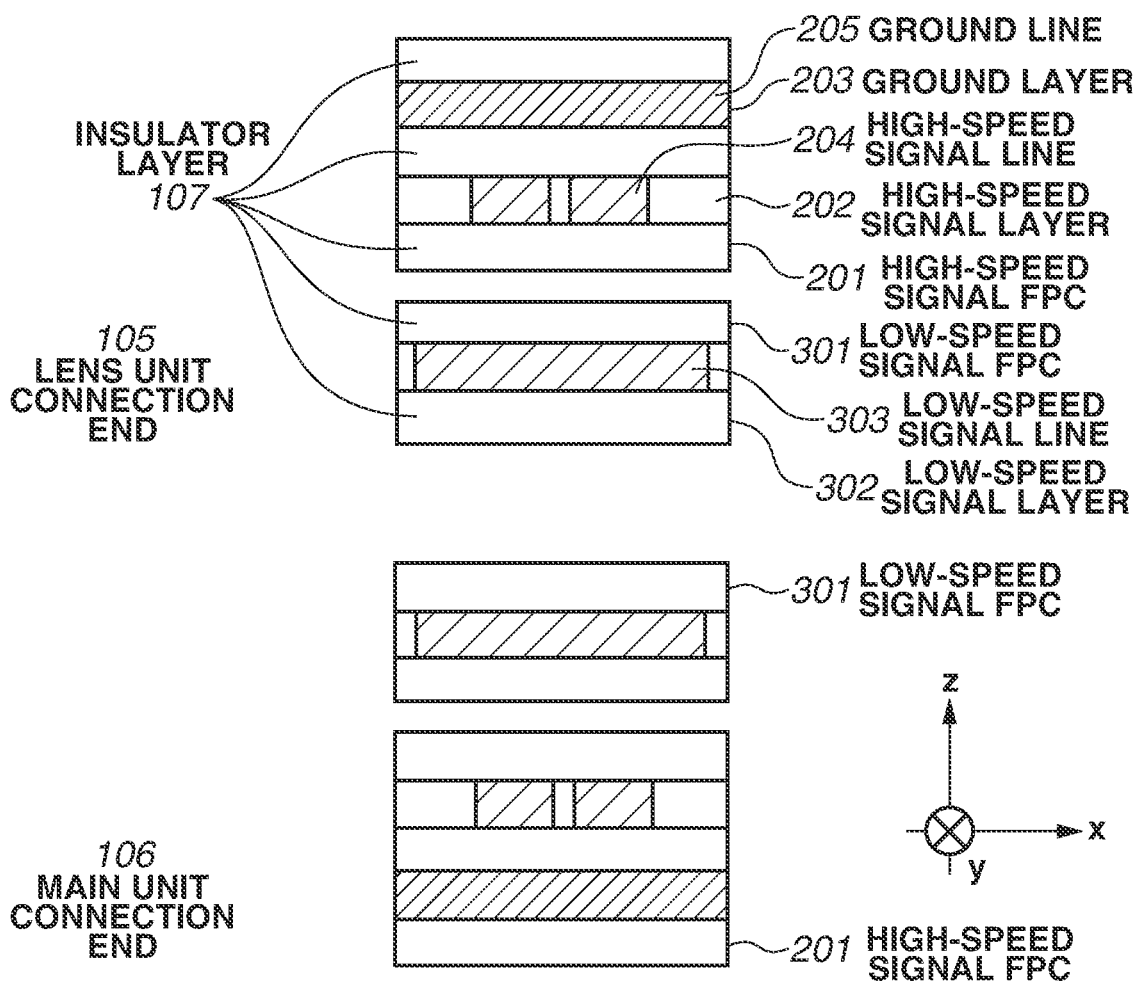
FIG. 24 is a wiring structure diagram of the FPCs according to the sixth exemplary embodiment.

FIG. 24 is a sectional view of FIG. 22 (section A of FIG. 23) taken along the xz plane, seen in the y-axis direction. A wiring structure of the FPC 104 will be described with reference to FIG. 24. First, the wiring structure of each conductor layer will be described. High-speed signal lines 204 such as a video signal line are laid in the high-speed signal layer 202. A ground line 205 such as a mesh ground is laid over the entire ground layer 203. A low-speed signal line 303 such as a driving signal line of an AF motor for AF driving is laid in the low-speed signal layer 302.

The overlapping of the wiring of the layers will be described. The ground layer 203 provides ground wiring overlapped to cover the outer side of the high-speed signal lines 204 of the high-speed signal layer 202 on the z-axis. Similarly, the low-speed signal layer 302 provides wiring overlapped to cover the inner side of the high-speed signal lines 204 on the z-axis. In such a manner, the high-speed signal lines 204 can be efficiently shielded.

There may be a plurality of high-speed signal lines 204, not just one. All the high-speed signal lines 204 may desirably be laid next to each other and covered with the ground line 205 and the low-speed signal line 303. In view of EMI shielding, the entire surface of the ground layer 203 may desirably be covered with the ground line 205 to provide a wide shielding area. The ground line 205 may be laid only in areas overlapping the high-speed signal lines 204. If the ground line 205 is laid only in areas overlapping the high-speed signal lines 204 in the ground layer 203, low-speed signal lines other than the ground line 205 may be laid in the remaining space in the ground layer 203. The ground line 205 may have gaps like meshes and slits. The ground line 205 may be a gapless one like a solid ground. If the ground layer 203 includes gaps as described above, the conductor volume decreases to soften the FPC 104 for improved durability.

Figure 25:
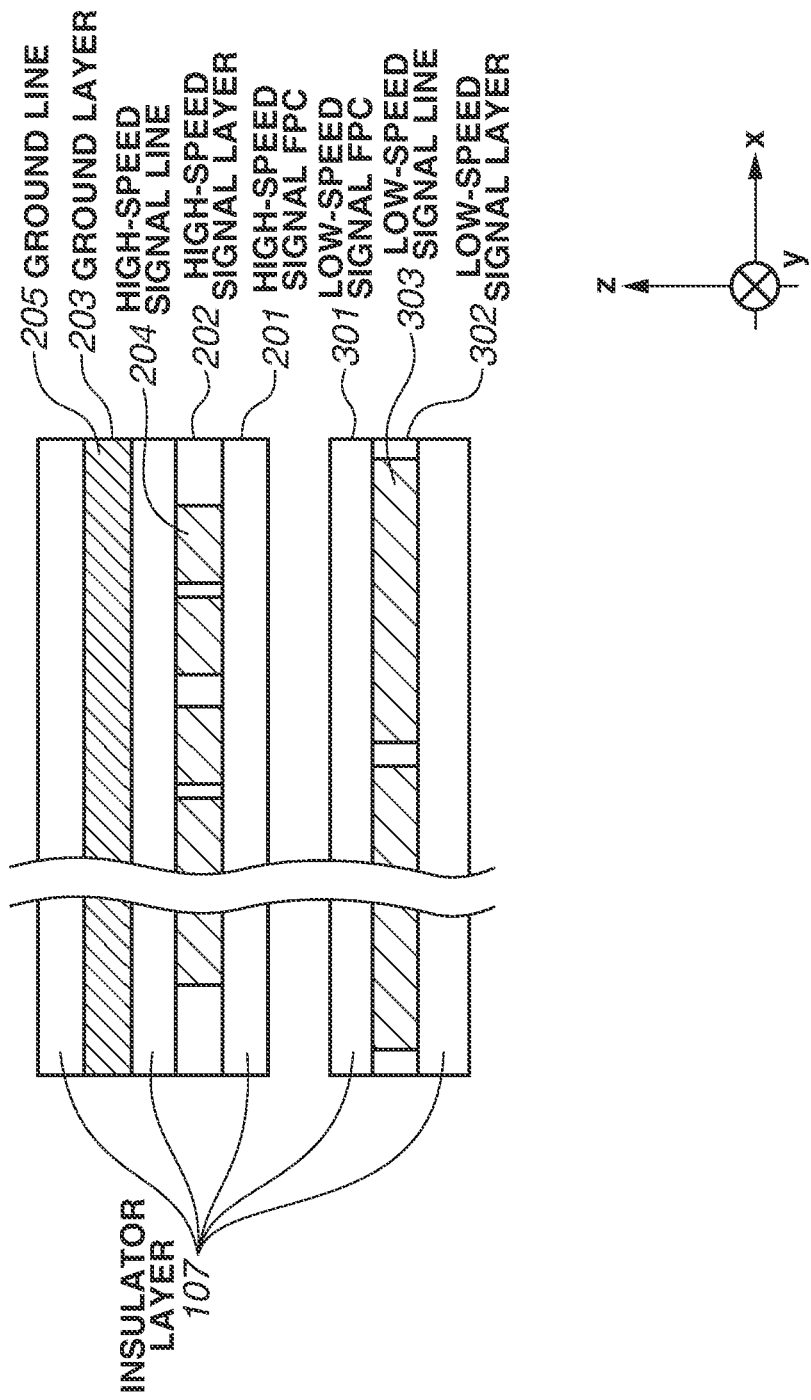
FIG. 25 is a wiring structure diagram illustrating multi-line wiring of the FPCs according to the sixth exemplary embodiment.

FIG. 25 illustrates a configuration in which the high-speed signal lines 204 are covered with a plurality of low-speed signal lines 303. In view of EMI shielding, a low-speed signal line 303 may desirably be laid by using a line having thickness enough to cover the high-speed signal lines 204. At that time a plurality of low-speed signal lines 303 may be laid, not just one. If a plurality of low-speed signal lines 303 is used for shielding, the shorter the line-to-line distance, the higher the shielding characteristic.

The principle and effect of shielding the high-speed signal lines 204 by the low-speed signal lines 303 will be described. Driving signal lines (several tens of kilohertz band) of an AF motor, having a sufficiently low frequency with respect to that of the high-speed signal lines 204 (several hundreds of megahertz band), are used as the low-speed signal lines 303. As seen from the high-speed signal lines 204, the low-speed signal lines 303 are equivalent to a direct-current (DC) potential, which enables EMI shielding. In other words, the low-speed signal FPC 301 itself has the function of suppressing noise of the high-speed signal FPC 201. Therefore, noise can be suppressed without the addition of a dedicated noise suppression member to the high-speed signal lines 204.

Figure 26:
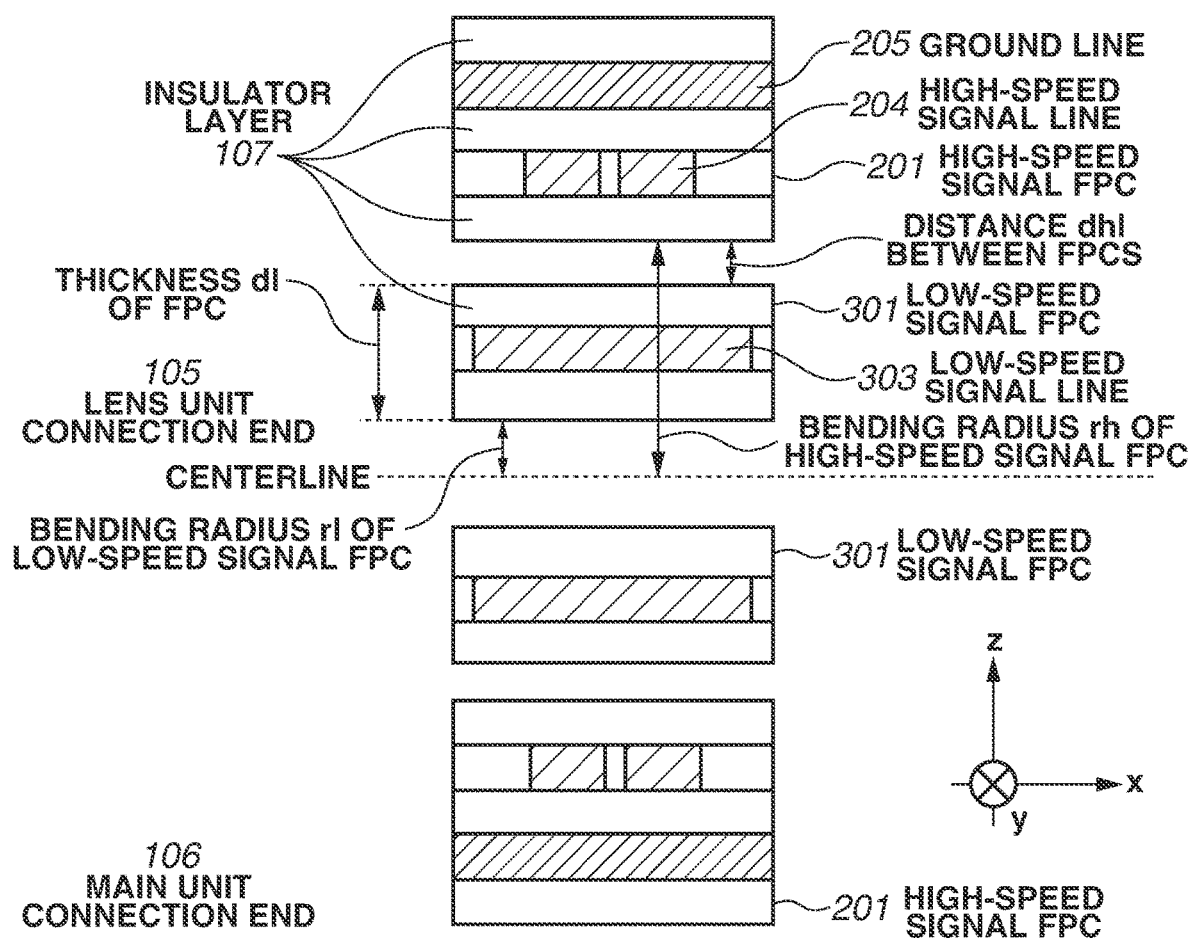
FIG. 26 is a diagram illustrating a distance between FPCs according to a seventh exemplary embodiment.

Next, a seventh exemplary embodiment of the present invention will be described. The seventh exemplary embodiment deals with a case in which the low-speed signal FPC 301 of the FPC 104 according to the sixth exemplary embodiment is hardened. FIG. 26 illustrates a sectional view of an overlap of two FPCs similar to those of FIG. 24 (section A of FIG. 23) in a thickness direction of the FPCs.

A structure for reducing a distance dhl between the low-speed signal FPC 301 and the high-speed signal FPC 201 illustrated in FIG. 26 to improve shielding characteristics will be described. The bending radius of an FPC is determined by the hardness of the FPC. The harder the FPC, the larger the bending radius. By making the low-speed signal FPC 301 harder than the high-speed signal FPC 201, the bending radius of the low-speed signal FPC 301 can be increased. With such a structure, the low-speed signal FPC 301 can be brought close to the high-speed signal FPC 201 for improved shielding characteristics. In view of EMI, the high- and low-speed signal FPCs 201 and 301 may desirably be brought close to each other so that the surface insulators make contact with each other. However, the reduced distance can cause crosstalk, depending on signal waveforms. In such a case, the signal waveforms may desirably be made less sharp to eliminate overshoots and undershoots for crosstalk suppression.

A method for hardening the low-speed signal FPC 301 will be described. A major factor of the hardness of an FPC is the thickness of the conductor layer(s). If the low-speed signal FPC 301 has a conductor thickness of 35 µm, the conductor thickness of the high-speed signal FPC 201 is set to be smaller than or equal to 35 µm. Since the high-speed signal FPC 201 has a two-layer structure, such a conductor thickness can be achieved by forming each layer with a conductor thickness of 12 µm.

The hardness also varies depending on the wiring area and material of the conductors, and the thickness and material of the insulators. The structure of the high- and low-speed signal FPCs 201 and 301 may desirably be determined in consideration of such factors.

Making the lower-speed signal FPC 301 harder than the high-speed signal FPC 201 improves EMI characteristics. The greater the difference in hardness, the higher the effect. Therefore, it is useful to make the low-speed signal FPC 301 hard relative to the high-speed signal FPC 201.

Next, an eighth exemplary embodiment of the present invention will be described. The eighth exemplary embodiment deals with a method for reducing the apparatus size by making the high-speed signal FPC 201 of the FPC 104 according to the sixth exemplary embodiment harder than the low-speed signal FPC 301.

First, concerning a conductor thickness, a tradeoff between electric characteristics and an apparatus size will be described. In view of the electric characteristics, by increasing the conductor thickness, resistance components can be reduced. Greater conductor thicknesses are therefore desirable. However, in view of the apparatus size, harder FPCs have larger bending radii. Smaller conductor thicknesses are therefore desirable. Whether to increase or decrease the conductor thickness is therefore not simply determinable. A structure that can miniaturize the structure of the FPC 104 according to the sixth exemplary embodiment with the same total thickness of the conductor layers will be described.

Figure 27:
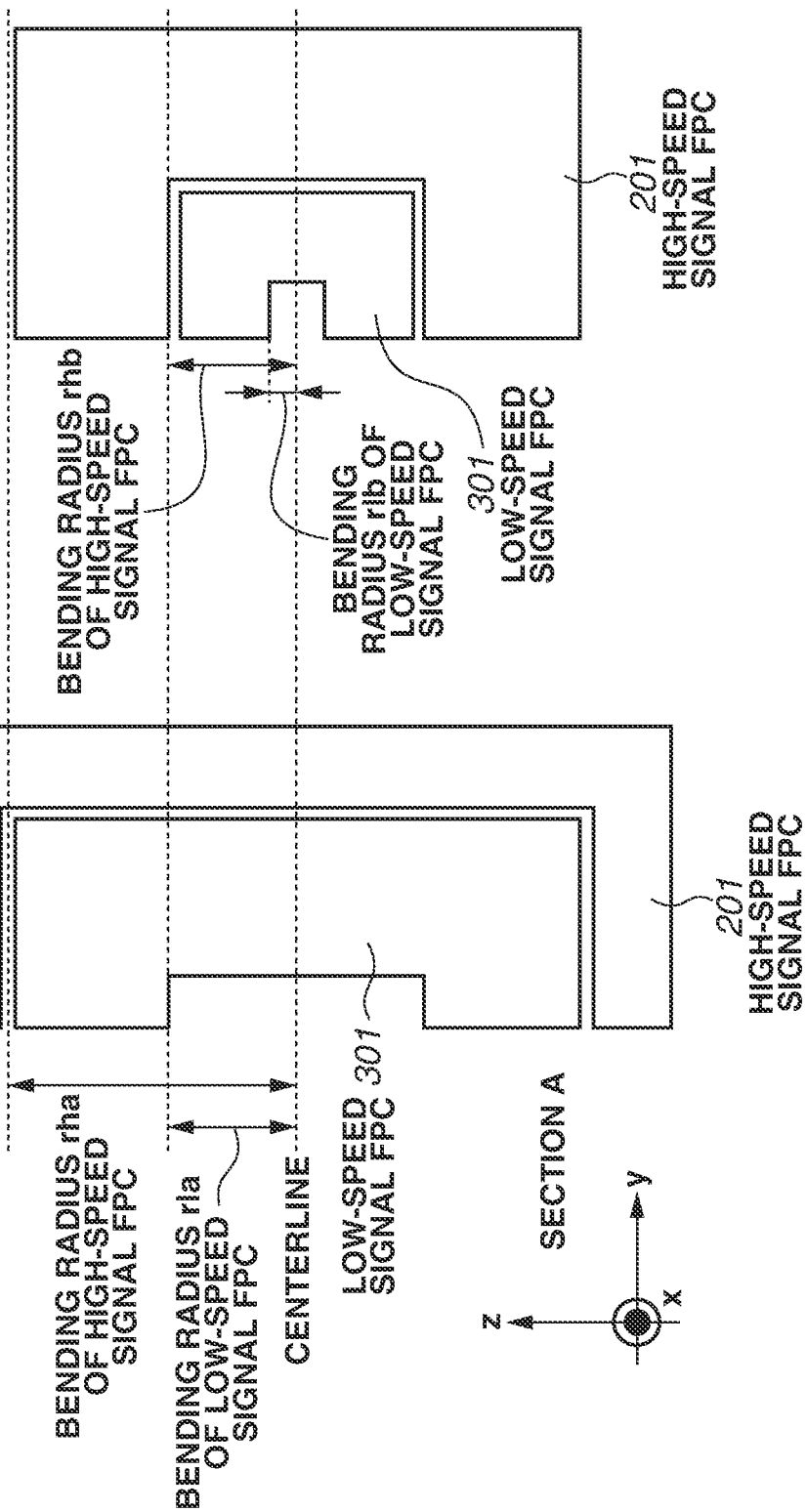
FIGS. 27A and 27B are diagrams illustrating miniaturization of FPCs according to an eighth exemplary embodiment.

FIGS. 27A and 27B are sectional views of FIG. 23 according to the sixth exemplary embodiment, taken along the section A. FIG. 27A illustrates a case in which the low-speed signal FPC 301 is hard. FIG. 27B illustrates a case in which the high-speed signal FPC 201 is hard. In FIGS. 27A and 27B, the total thickness of all the conductor layers is the same.

As illustrated in FIG. 27A, if the inner low-speed signal FPC 301 is hard, the low-speed signal FPC 301 has a large bending radius rla. Therefore, the high-speed signal FPC 201 overlapped on the outer side has a large bending radius rha. On the other hand, referring to FIG. 27B, a case in which the two FPCs 201 and 301 are reversed in hardness, i.e., the outer high-speed signal FPC 201 is hard and the inner low-speed signal FPC 301 is soft will be described. The low-speed signal FPC 301 has a bending radius rlb smaller than the bending radius rla in FIG. 27A. Since the high-speed signal FPC 201 harder than the low-speed signal FPC 301 is overlapped on the outside thereof, the bending radius rhb of the high-speed signal FPC 201 is determined by the hardness of the high-speed signal FPC 201 regardless of the bending radius rlb of the low-speed signal FPC 301. Therefore, bending radius rla of the low-speed signal FPC 301 in FIG. 27A coincides with the bending radius rhb of the high-speed signal FPC 201 in FIG. 27B. A comparison between the sizes of the folding portions in FIGS. 27A and 27B shows that if the high- and low-speed signal FPCs 201 and 301 have the same total thickness, the folded FPCs 201 and 301 in FIG. 27A are greater by the thickness Hha of the high-speed signal FPC 201. In other words, making the outer high-speed signal FPC 201 harder than the inner low-speed signal FPC 301 enables miniaturization thereof. A two-layer FPC has a thickness of approximately 0.04 to 0.30 mm. Since the U shape provides upper and lower, i.e., two strokes of reduction, an improvement of approximately 0.08 to 0.60 mm in diameter can thus be expected.

A specific design example will be described. If the low-speed signal FPC 301 has a conductor thickness of 35 µm, the conductor thickness of the high-speed signal FPC 201 is set to be greater than 35 µm. Since the high-speed signal FPC 201 has a two-layer structure, such a conductor thickness can be achieved by forming each layer with a conductor thickness of 18 µm, i.e., the two layers with a conductor thickness of 36 µm.

The hardness also varies depending on the wiring area and material of the conductors, and the thickness and material of the insulators. The structure of the high- and low-speed signal FPCs 201 and 301 may desirably be determined in consideration of such factors.

Making the high-speed signal FPC 201 harder than the low-speed signal FPC 301 enables miniaturization thereof. To that end, the high-speed signal FPC 201 may be hardened relative to the low-speed signal FPC 301.

Figure 28:
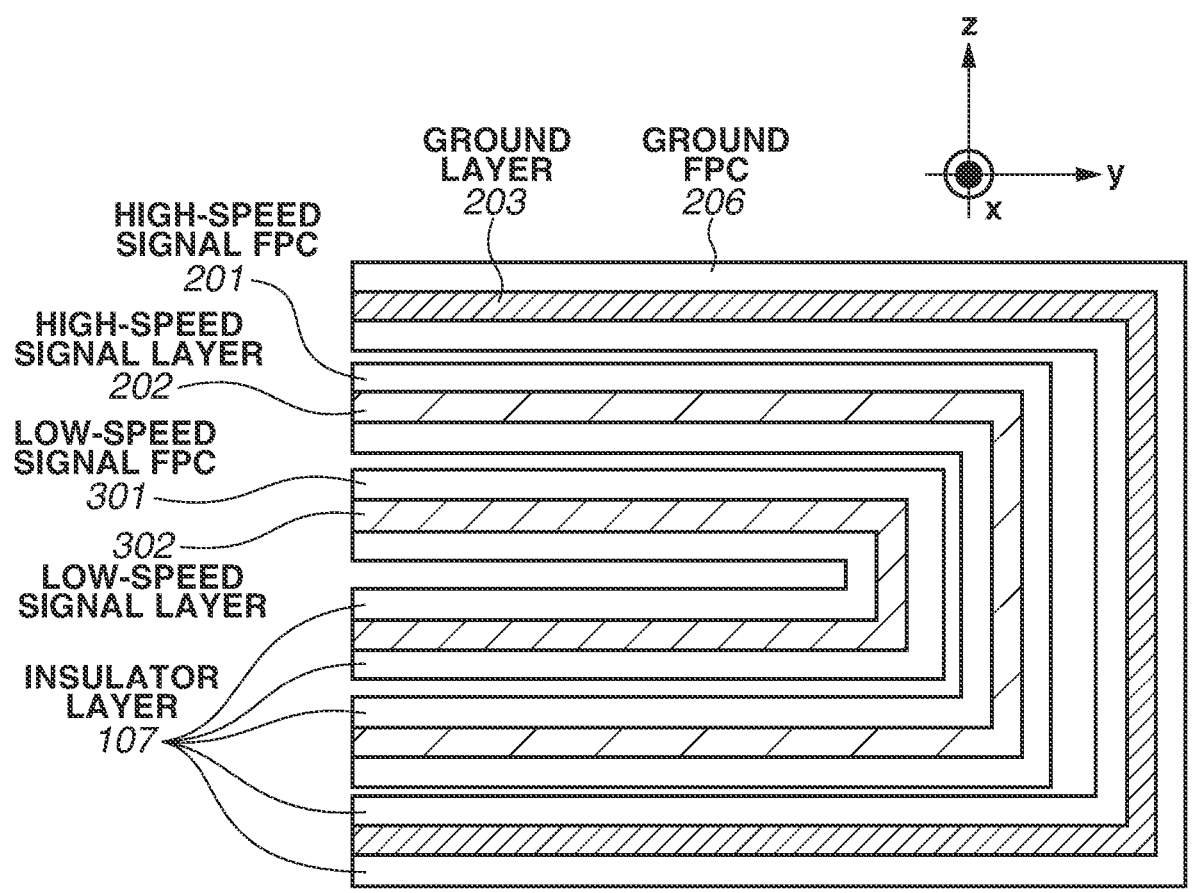
FIG. 28 is a diagram illustrating a three-part divided structure of FPCs according to a ninth exemplary embodiment.

Next, a ninth exemplary embodiment of the present invention will be described. The ninth exemplary embodiment deals with a case in which the two-layer FPC according to the sixth exemplary embodiment is divided into two FPCs. FIG. 28 is a sectional view illustrating a layer configuration in which the ground layer 203 of the high-speed signal FPC 201, which is the two-layer FPC, is separated. As illustrated in FIG. 28, all the FPCs are configured as single layer FPCs. The low-speed signal FPC 301, the high-speed signal FPC 201, and a ground FPC 206 are arranged in this order from the innermost side of the U shape. Such a structure can reduce the thickness per FPC to enhance the bending durability of the FPCs.

By making the inner FPCs of the U shape hard, EMI shielding can be robust. For example, by making the innermost low-speed signal FPC 301 the hardest and the outermost ground FPC 206 the softest, the overlapping portions of the FPCs can be brought into contact with each other. This not only provides robust EMI shielding, but also can stabilize the distances between the conductor layers for stable impedance and improved waveform quality.

Figure 29:
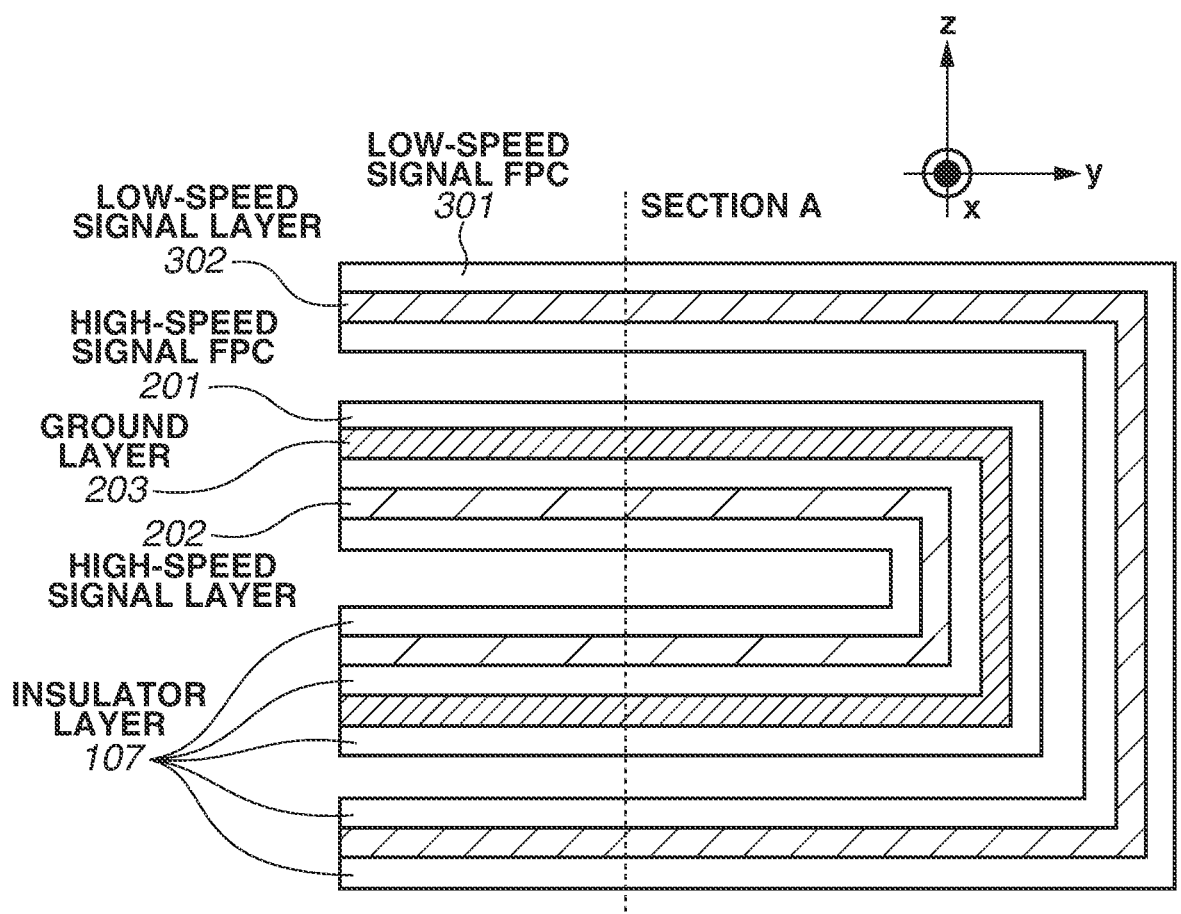
FIG. 29 is a layer configuration diagram of FPCs according to a tenth exemplary embodiment.

FIG. 29 is a sectional view of FIG. 12 taken along the yz plane, seen in the x-axis direction. The layer structure will be described with reference to FIG. 29. The low-speed signal FPC 301 is a single layer FPC including one conductor layer. In FIG. 29, the low-speed signal layer 302 refers to a conductor layer that includes only low-speed signal lines without including the electrical signal lines having the highest speed among those of the electrical signals to be transmitted by the FPC 104. The high-speed signal FPC 201 is a two-layer FPC including two conductor layers. The conductor layers of the high-speed signal FPC 201 are configured in such a manner that a high-speed signal layer 202 is on the inner side of the U shape and a ground layer 203 is on the outer side. The high-speed signal layer 202 refers to a conductor layer that includes the electrical signal lines having the highest speed among those of the electrical signals to be transmitted by the FPC 104. Other signal lines and power supply lines may be laid side by side. The ground layer 203 is a wiring layer including a ground line. The ground layer 203 provides ground wiring so as to overlap the high-speed signal lines.

With such a structure, the high-speed signal layer 202 on the innermost side of the U shape is doubly shielded by the ground layer 203 and the low-speed signal layer 302. Therefore, EMI characteristics are improved. In addition, the provision of the ground layer 203 between the low-speed signal layer 302 and the high-speed signal layer 202 can prevent crosstalk between the low-speed signal lines and the high-speed signal lines.

Figure 30:
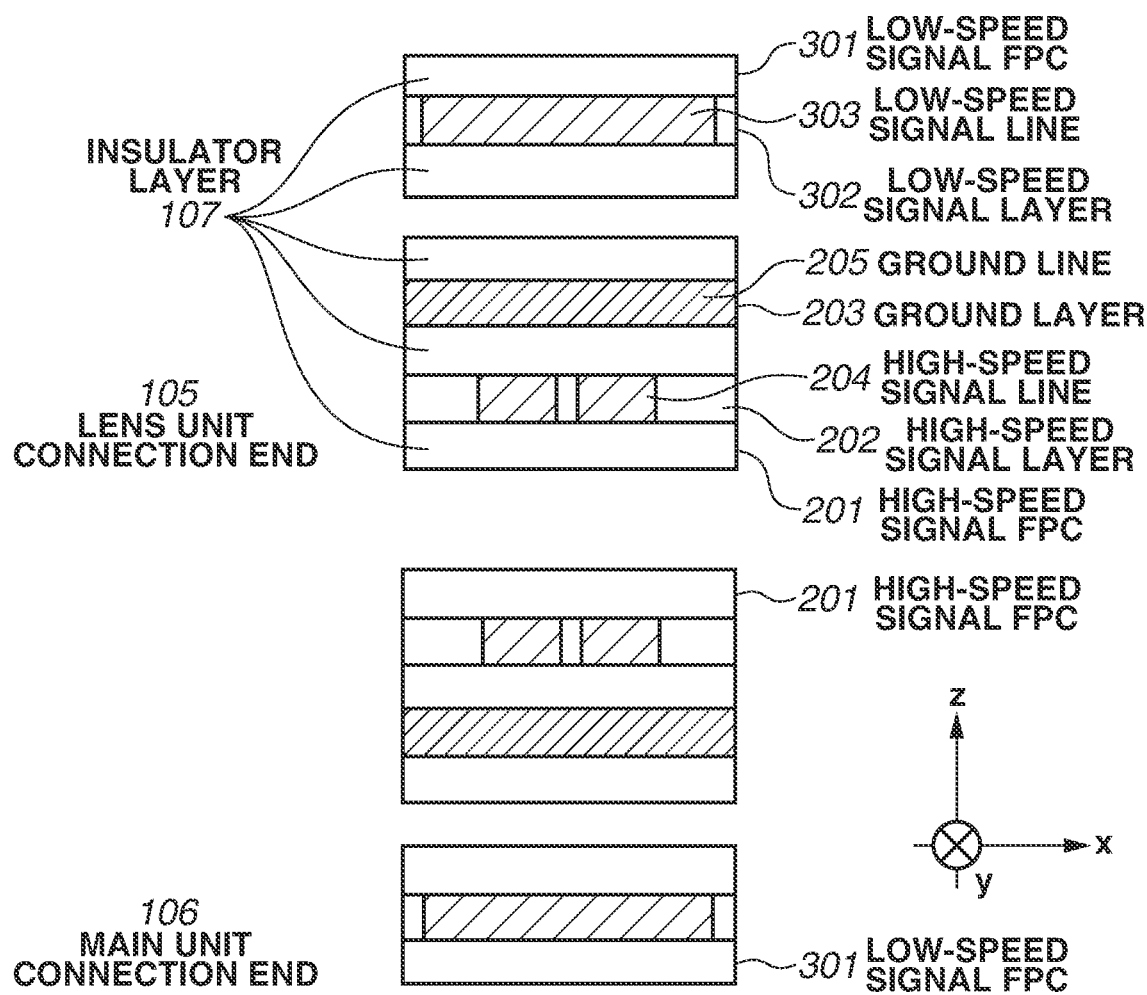
FIG. 30 is a wiring structure diagram of the FPCs according to the tenth exemplary embodiment.

FIG. 30 is a sectional view of FIG. 12 (section A of FIG. 29) taken along the xz plane, seen in the y-axis direction. A wiring structure of the FPC 104 will be described with reference to FIG. 30. First, the wiring structure of each conductor layer will be described. High-speed signal lines 204 such as a video signal line are laid in the high-speed signal layer 202. A ground line 205 like a mesh ground is laid over the entire ground layer 203. A low-speed signal line 303 such a driving signal line of an AF motor for AF driving is laid in the low-speed signal layer 302.

The overlapping of the wiring of the layers will be described. The ground layer 203 provides ground wiring overlapped to cover the high-speed signal lines 204 of the high-speed signal layer 202 on the z-axis. The low-speed signal layer 302 similarly provides wiring overlapped to cover the high-speed signal lines 204 on the z-axis. In such a manner, the high-speed signal lines 204 can be efficiently shielded.

There may be a plurality of high-speed signal lines 204, not just one. All the high-speed signal lines 204 may desirably be laid next to each other and covered with the ground line 205 and the low-signal line 303. In view of EMI shielding, the ground line 205 may desirably cover the entire surface of the ground layer 203 to provide a wide shielding surface. The ground line 205 may be laid only in areas overlapping the high-speed signal lines 204. If the ground line 205 is laid only in areas overlapping the high-speed signal lines 204 in the ground layer 203, low-speed signal lines other than the ground line 205 may be laid in the remaining space in the ground layer 203. The ground line 205 may have gaps like meshes and slits. The ground line 205 may be a gapless one like a solid ground. If the ground layer 203 includes gaps as described above, the conductor volume decreases to soften the FPC 104 for improved durability.

Figure 31:
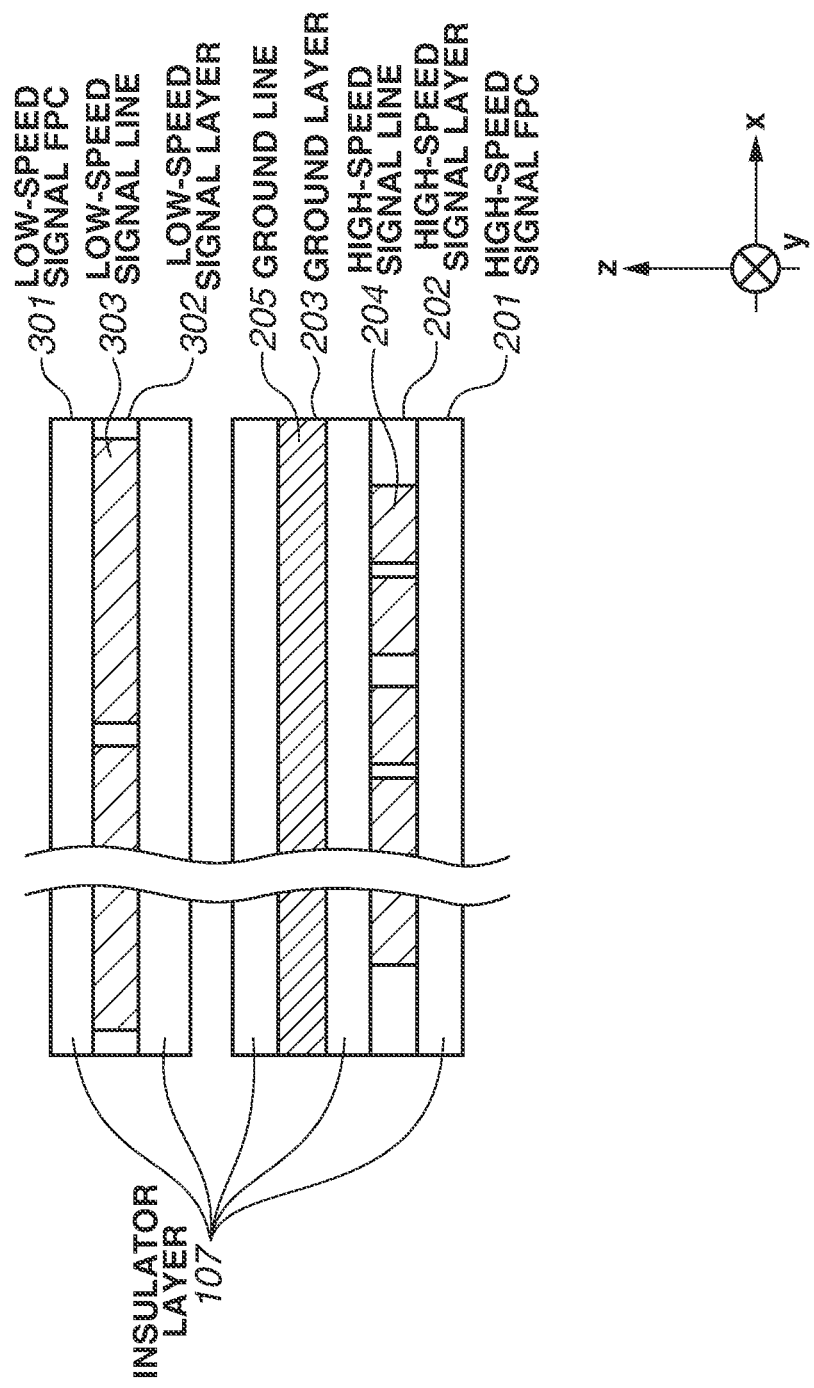
FIG. 31 is a wiring structure diagram illustrating multi-line wiring of the FPCs according to the tenth exemplary embodiment.

FIG. 31 illustrates a configuration in which the high-speed signal lines 204 are covered with a plurality of low-speed signal lines 303. In view of EMI shielding, a low-speed signal line 303 may desirably be laid by using a line having thickness enough to cover the high-speed signal lines 204. At that time, a plurality of low-speed signal lines 303 may be laid, not just one. If a plurality of low-speed signal lines 303 is used for shielding, the shorter the line-to-line distance, the higher the shielding characteristic.

The principle and effect of shielding the high-speed signal lines 204 by the low-speed signal lines 303 will be described. Driving signal lines (several tens of kilohertz band) of an AF motor, having a sufficiently low frequency with respect to that of the high-speed signal lines 204 (several hundreds of megahertz band), are used as the low-speed signal lines 303. As seen from the high-speed signal lines 204, the low-speed signal lines 303 are equivalent to a direct-current (DC) potential, which enables EMI shielding. In other words, the low-speed signal FPC 301 itself has the function of suppressing noise of the high-speed signal FPC 201. Therefore, noise can be suppressed without the addition of a dedicated noise suppression member to the high-speed signal lines 204.

Figure 32:
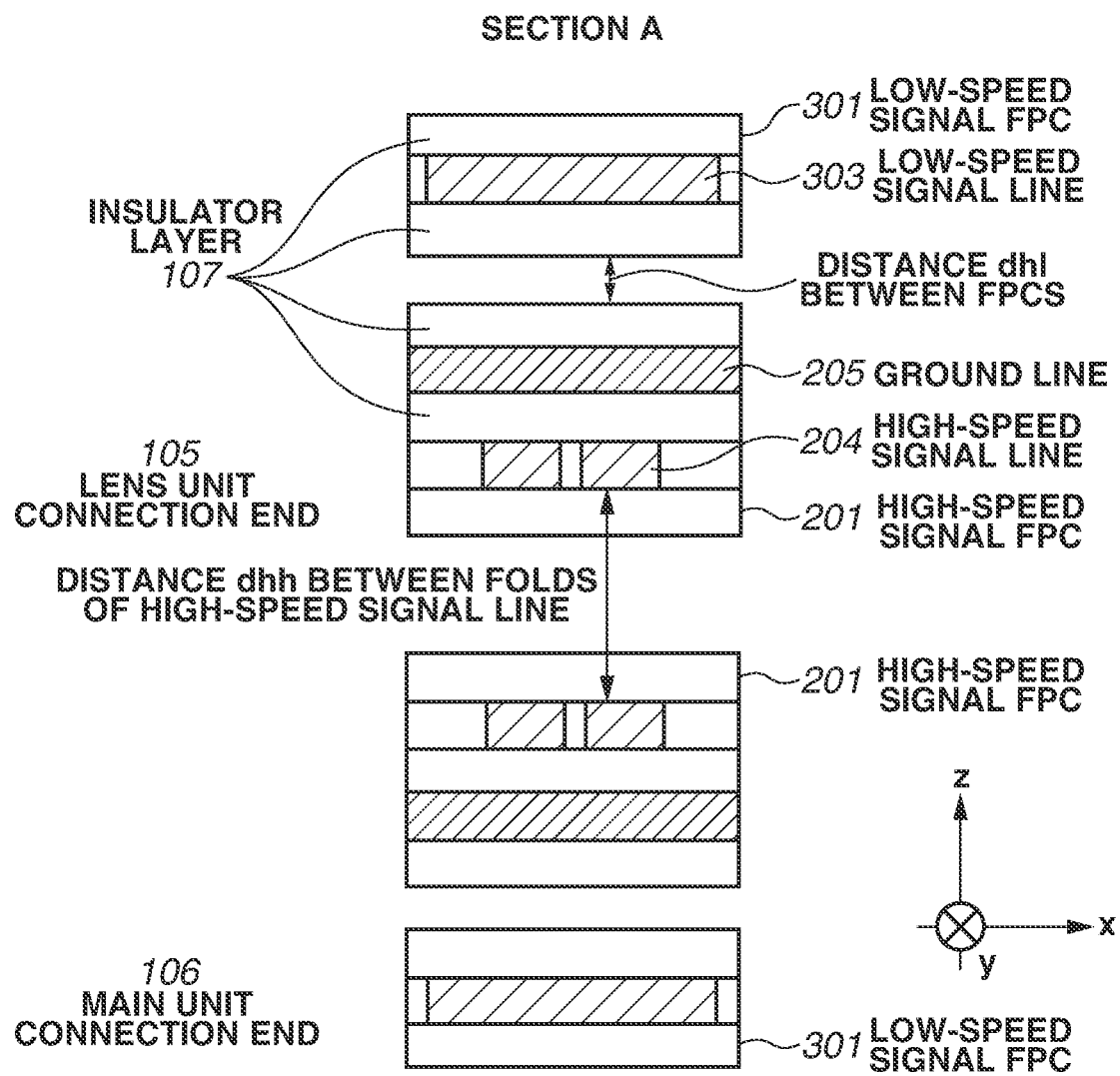
FIG. 32 is a diagram illustrating a distance between FPCs according to an eleventh exemplary embodiment.

Next, an eleventh exemplary embodiment of the present invention will be described. The eleventh exemplary embodiment deals with a case in which the high-speed signal FPC 201 of the FPC 104 according to the sixth exemplary embodiment is hardened. FIG. 32 illustrates a sectional view of an overlap of two FPCs similar to those of FIG. 30 (section A of FIG. 29) in a thickness direction of the FPCs.

A structure for reducing a distance dh1 between the high-speed signal FPC 201 and the low-speed signal FPC 301 illustrated in FIG. 32 to improve shielding characteristics will be described. The bending radius of an FPC is determined by the hardness of the FPC. The harder the FPC, the larger the bending radius. By making the high-speed signal FPC 201 harder than the low-speed signal FPC 301, the bending radius of the high-speed signal FPC 201 can be increased. With such a structure, the high-speed signal FPC 201 can be brought close to the low-speed signal FPC 301 for improved shielding characteristics.

A method for hardening the high-speed signal FPC 201 will be described. A major factor of the hardness of an FPC is the thickness of the conductor layer(s). If the low-speed signal FPC 301 has a conductor thickness of 35 µm, the conductor thickness of the high-speed signal FPC 201 is set to be greater than or equal to 35 µm. Since the high-speed signal FPC 201 has a two-layer structure, such a conductor thickness can be achieved by forming each layer with a conductor thickness of 18 µm.

The hardness also varies depending on the wiring area and material of the conductors, and the thickness and material of the insulators. The structure of the high- and low-speed signal FPCs 201 and 301 may desirably be determined in consideration of such factors.

Making the high-speed signal FPC 201 harder than the low-speed signal FPC 301 improves EMI characteristics. The greater the difference therebetween in hardness, the higher the effect. Therefore, high-speed signal FPC 201 may be hardened relative to the low-speed signal FPC 301.

Making the high-speed signal FPC 201 hard can also reduce crosstalk between the high-speed signal lines 204. The folding structure such as illustrated in FIG. 29 causes crosstalk since the high-speed signal lines 204 are opposed to each other. The distance between the high-speed signal lines 204 will be denoted by dhh. The distance dhh between the high-speed signal lines 204 is determined by the bending radius of the high-speed signal FPC 201. The harder the high-speed signal FPC 201, the larger the bending radius and the greater the distance dhh between the high-speed signal lines 204. By increasing the distance dhh between the high-speed signal lines 204, the coupling capacitance between the high-speed signal lines 204 and reduce crosstalk can be reduced.

Figure 33:
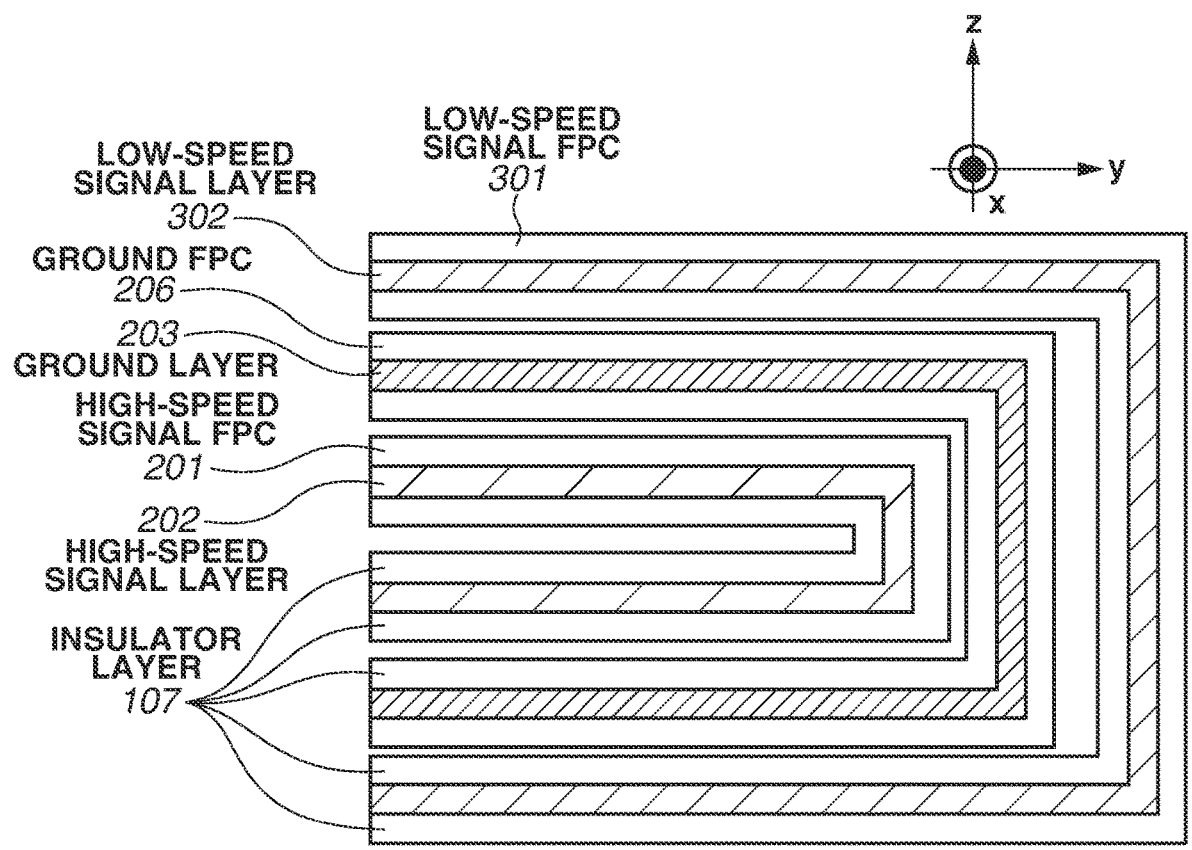
FIG. 33 is a diagram illustrating a three-part divided structure of FPCs according to a twelfth exemplary embodiment.

Next, a twelfth exemplary embodiment of the present invention will be described. The twelfth exemplary embodiment deals with a case in which the two-layer PFC according to the sixth exemplary embodiment is divided into two FPCs. FIG. 33 is a sectional view illustrating a layer structure when the ground layer 203 of the high-speed signal FPC 201, which is the two-layer FPC, is separated. As illustrated in FIG. 33, all of the FPCs are configured as single layer FPCs. The high-speed signal FPC 201, a ground FPC 206, and the low-speed signal FPC 301 are arranged in this order from the innermost side of the U shape. Such a structure can reduce the thickness per FPC to enhance the bending durability of the FPCs.

Hardening the inner FPCs of the U shape enables EMI shielding robust. For example, by making the innermost high-speed signal FPC 201 hardest and the outermost low-speed signal FPC 301 softest, the overlapping portions of the FPCs can be brought into contact with each other. This not only provides robust EMI shielding, but also can stabilize the distances between the conductor layers. As a result, stable impedance and thus improved waveform quality can be obtained.

The exemplary embodiments of the imaging apparatus according to the present invention have been described above. In the exemplary embodiments, the arc-shaped first and second portions are bent around axes orthogonal to the axes in the pan and tilt rotation directions, respectively. However, the exemplary embodiments can be similarly applied to any combinations of rotation directions including a roll rotation direction.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2016-211527, filed Oct. 28, 2016, and No. 2017-146340, filed Jul. 28, 2017, which are hereby incorporated by reference herein in their entirety.

What is claimed is:

1. An imaging apparatus comprising:
a lens unit including a lens and an image sensor, wherein the lens unit can be tilted about a tilt rotation axis;
a rotating unit configured to rotatably support the lens unit and configured to be rotatable about a pan rotation axis;
a non-rotating unit configured to rotatably support the rotating unit;
a first substrate for controlling the imaging apparatus, the first substrate being disposed on the non-rotating unit;
a second substrate for the image sensor, the second substrate being disposed on the lens unit;
a third substrate for the lens, the third substrate being disposed on the lens unit;
a first flexible printed circuit configured to connect the first substrate with the second substrate; and
a second flexible printed circuit configured to connect the first substrate with the third substrate,
wherein the first flexible printed circuit includes an arc-shaped first portion coaxial with the pan rotation axis, and an arc-shaped second portion coaxial with the tilt rotation axis,
wherein the second flexible printed circuit includes an arc-shaped third portion coaxial with the pan rotation axis, and an arc-shaped fourth portion coaxial with the tilt rotation axis,
wherein the first portion and the third portion are bent around an axis orthogonal to the pan rotation axis, and
wherein the axis about which the first portion is bent is different from the axis about which the third portion is bent.

2. The imaging apparatus according to claim 1, wherein the first and second flexible printed circuits are arranged in an overlapping manner.

3. The imaging apparatus according to claim 1, wherein the rotating unit and the non-rotating unit include a protruding portion or a hook portion configured to fix the first portion of the first flexible printed circuit and the third portion of the second flexible printed circuit.

4. The imaging apparatus according to claim 3, wherein the first portion of the first flexible printed circuit and the third portion of the second flexible printed circuit each include a hole which the protruding portion extends through.

5. The imaging apparatus according to claim 1, wherein the lens unit includes a hook portion configured to fix the second portion of the first flexible printed circuit and the fourth portion of the second flexible printed circuit.

6. The imaging apparatus according to claim 1, wherein the rotating unit and the non-rotating unit include a groove or a protrusion configured to guide the first portion and the third portion.

7. The imaging apparatus according to claim 1,
wherein the first flexible printed circuit includes a first straight portion which connects the first and second portions,
wherein the second flexible printed circuit includes a third straight portion which connects the third and fourth portions, and
wherein the first straight portion and the third straight portions are bent around an axis parallel to an optical axis of the lens unit.

8. The imaging apparatus according to claim 1,
wherein the first flexible printed circuit includes a second straight portion extending from the second portion,
wherein the second flexible printed circuit includes a fourth straight portion extending from the fourth portion,
wherein the second straight portion is bent to be arranged in parallel with the pan rotation axis, and
wherein the fourth straight portion is bent to be arranged in parallel with an optical axis of the lens unit.

9. The imaging apparatus according to claim 1, wherein the rotating unit and the non-rotation unit are configured to cover the first portion of the first flexible printed circuit and the third portion of the second flexible printed circuit.

10. The imaging apparatus according to claim 1, wherein at least one of the rotating unit and the non-rotating unit is made of resin having an electromagnetic shielding property.

11. The imaging apparatus according to claim 1, wherein the first portion of the first flexible printed circuit and the third portion of the second flexible printed circuit have different lengths.

12. The imaging apparatus according to claim 1, wherein the first portion of the first flexible printed circuit and the third portion of the second flexible printed circuit have the same length, and are fixed to the rotating unit and the non-rotating unit at different positions.

13. The imaging apparatus according to claim 1,
wherein the first flexible printed circuit is a high-speed signal flexible printed circuit configured to transmit a high-speed signal having a highest frequency among signals to be transmitted by the flexible printed circuit,
wherein the second flexible printed circuit is a low-speed signal flexible printed circuit configured to transmit a low-speed signal different from the high-speed signal,
wherein the high-speed signal flexible printed circuit includes a ground layer and a high-speed signal layer,
wherein, when the first and second flexible printed circuits are bent, the low-speed signal flexible printed circuit is arranged on an outer side of the high-speed signal flexible printed circuit, and
wherein the high-speed signal flexible printed circuit has the high-speed signal layer outside and the ground layer inside.

14. The imaging apparatus according to claim 13, wherein the high-speed signal flexible printed circuit is made harder than the low-speed signal flexible printed circuit.

15. The imaging apparatus according to claim 13, wherein the low-speed signal flexible printed circuit is made harder than the high-speed signal flexible printed circuit.

16. The imaging apparatus according to claim 13, wherein wiring of the low-speed signal flexible printed circuit is laid at a position overlapping with wiring of the high-speed signal flexible printed circuit.

17. The imaging apparatus according to claim 1, further comprising a ground flexible printed circuit in which ground wiring is laid,
wherein the first flexible printed circuit is a high-speed signal flexible printed circuit configured to transmit a high-speed signal having a highest frequency among signals to be transmitted by the flexible printed circuit,
wherein the second flexible printed circuit is a low-speed signal flexible printed circuit configured to transmit a low-speed signal different from the high-speed signal, and
wherein, when the first and second flexible printed circuits are bent, the ground flexible printed circuit, the high-speed signal flexible printed circuit, and the low-speed signal flexible printed circuit are arranged in this order from an innermost side.

18. The imaging apparatus according to claim 17, wherein a flexible printed circuit arranged on an inner side is made harder than a flexible printed circuit arranged on an outer side.

19. The imaging apparatus according to claim 1,
wherein the first flexible printed circuit is a high-speed signal flexible printed circuit configured to transmit a high-speed signal having a highest frequency among signals to be transmitted by the flexible printed circuit,
wherein the second flexible printed circuit is a low-speed signal flexible printed circuit configured to transmit a low-speed signal different from the high-speed signal,
wherein the high-speed signal flexible printed circuit includes a ground layer and a high-speed signal layer,
wherein, when the first and second flexible printed circuits are bent the low-speed signal flexible printed circuit is arranged on an inner side of the high-speed signal flexible printed circuit, and
wherein the high-speed signal flexible printed circuit has the high-speed signal layer inside and the ground layer outside.

20. The imaging apparatus according to claim 19, wherein wiring of the low-speed signal flexible printed circuit is laid at a position overlapping with wiring of the high-speed signal flexible printed circuit.

21. The imaging apparatus according to claim 19, wherein the low-speed signal flexible printed circuit is made harder than the high-speed signal flexible printed circuit.

22. The imaging apparatus according to claim 19, wherein the high-speed signal flexible printed circuit is made harder than the low-speed signal flexible printed circuit.

23. The imaging apparatus according to claim 1, further comprising a ground flexible printed circuit in which ground wiring is laid,
wherein the first flexible printed circuit is a high-speed signal flexible printed circuit configured to transmit a high-speed signal having a highest frequency among signals to be transmitted by the flexible printed circuit,
wherein the second flexible printed circuit is a low-speed signal flexible printed circuit configured to transmit a low-speed signal different from the high-speed signal, and
wherein, when the first and second flexible printed circuits are bent, the low-speed signal flexible printed circuit, the high-speed signal flexible printed circuit, and the ground flexible printed circuit are arranged in this order from an innermost side.

24. The imaging apparatus according to claim 23, wherein a flexible printed circuit arranged on an inner side is made harder than a flexible printed circuit arranged on an outer side.

25. The imaging apparatus according to claim 1,
wherein the first flexible printed circuit is a high-speed signal flexible printed circuit configured to transmit a high-speed signal having a highest frequency among signals to be transmitted by the flexible printed circuit,
wherein the second flexible printed circuit is a low-speed signal flexible printed circuit configured to transmit a low-speed signal different from the high-speed signal,
wherein the high-speed signal flexible printed circuit includes a ground layer and a high-speed signal layer,
wherein, when the first and second flexible printed circuits are bent, the low-speed signal flexible printed circuit is arranged on an outer side of the high-speed signal flexible printed circuit, and
wherein the high-speed signal flexible printed circuit has the high-speed signal layer inside and the ground layer outside.

26. The imaging apparatus according to claim 1, wherein wiring of the low-speed signal flexible printed circuit is laid at a position overlapping wiring of the high-speed signal flexible printed circuit.

27. The imaging apparatus according to claim 25, wherein the high-speed signal flexible printed circuit is made harder than the low-speed signal flexible printed circuit.

28. The imaging apparatus according to claim 25, wherein the low-speed signal flexible printed circuit is made harder than the high-speed signal flexible printed circuit.

29. The imaging apparatus according to claim 1, further comprising a ground flexible printed circuit in which ground wiring is laid,
wherein the first flexible printed circuit is a high-speed signal flexible printed circuit configured to transmit a high-speed signal having a highest frequency among signals to be transmitted by the flexible printed circuit, wherein the second flexible printed circuit is a low-speed signal flexible printed circuit configured to transmit a low-speed signal different from the high-speed signal, and wherein, when the first and second flexible printed circuits are bent, the high-speed signal flexible printed circuit, the ground flexible printed circuit, and the low-speed signal flexible printed circuit are arranged in this order from an innermost side.

30. The imaging apparatus according to claim 29, wherein a flexible printed circuit arranged on an inner side is made harder than a flexible printed circuit arranged on an outer side.

* * * * *